(12) United States Patent  
Madeley et al.

(10) Patent No.: US 11,054,478 B1  
(45) Date of Patent: Jul. 6, 2021

(54) MAGNETIC BATTERY TESTER HOUSING

(71) Applicant: Interstate Battery Systems International, Inc., Dallas, TX (US)

(72) Inventors: Brian Paul Madeley, Dallas, TX (US); Clifford Sewing, Dallas, TX (US)

(73) Assignee: Interstate Battery Systems International, Inc., Dallas, TX (US)

( * ) Notice: Subject to any disclaimer, the term of this patent is extended or adjusted under 35 U.S.C. 154(b) by 29 days.

(21) Appl. No.: 16/668,884

(22) Filed: Oct. 30, 2019

Related U.S. Application Data

(60) Provisional application No. 62/752,864, filed on Oct. 30, 2018.

(51) Int. Cl.
| | |
|---|---|
| *G01R 31/385* | (2019.01) |
| *G01R 31/36* | (2020.01) |
| *H01M 10/42* | (2006.01) |
| *H01R 11/11* | (2006.01) |
| *G01R 31/364* | (2019.01) |

(52) U.S. Cl.
CPC ........ *G01R 31/385* (2019.01); *G01R 31/364* (2019.01); *G01R 31/3646* (2019.01); *H01M 10/4285* (2013.01); *H01R 11/11* (2013.01)

(58) Field of Classification Search
None
See application file for complete search history.

(56) References Cited

U.S. PATENT DOCUMENTS

| | | | | |
|---|---|---|---|---|
| 3,493,863 | A * | 2/1970 | Girdwood | G01R 19/16542 324/145 |
| 10,753,981 | B2 * | 8/2020 | Madeley | G01R 31/371 |
| 2018/0287414 | A1 * | 10/2018 | Teich | H02J 50/10 |
| 2019/0072615 | A1 * | 3/2019 | Madeley | H01M 10/4285 |
| 2020/0174078 | A1 * | 6/2020 | Salo, III | G07C 5/0808 |

* cited by examiner

*Primary Examiner* — Jermele M Hollington  
(74) *Attorney, Agent, or Firm* — Ferguson Braswell Fraser Kubasta PC; Elizabeth Philip Dahm; Kelly J. Kubasta

(57) ABSTRACT

In various implementations, a housing for a battery tester may include a body with a first side and an opposing second side. The first side may include a presentation member, such as a screen and an input member. The screen may include a touch screen and/or the input member may include a keypad, such as a keypad with arrows. The second side may be magnetic such that the battery tester can be coupled to a magnetic surface. The second side may, in some implementations, include holster(s) that allows clamps to be stored in the holster. The holster(s) may be removable.

20 Claims, 42 Drawing Sheets

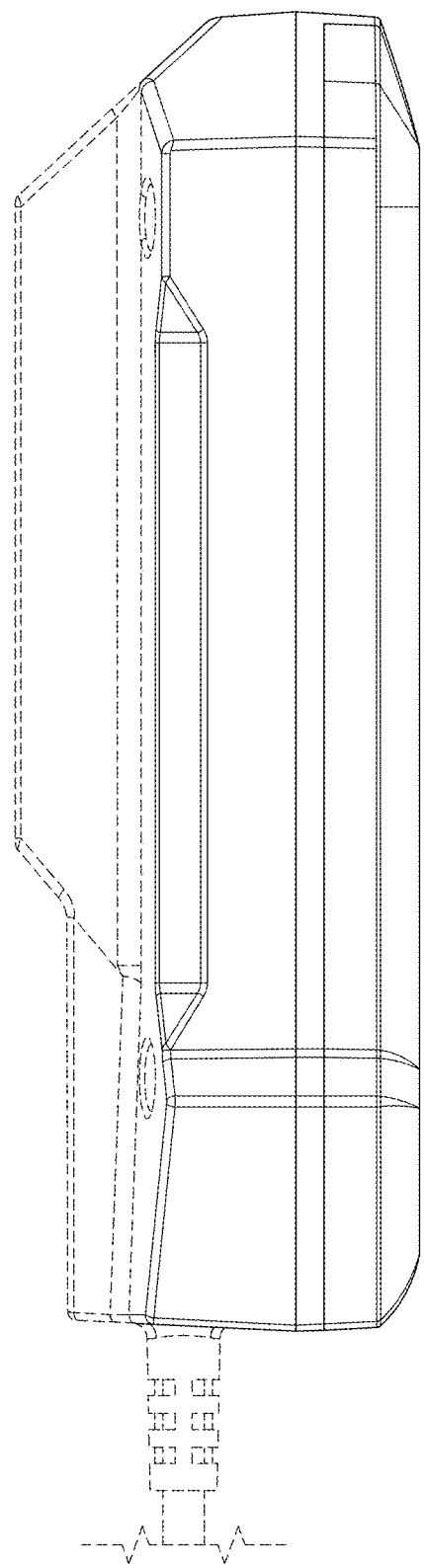
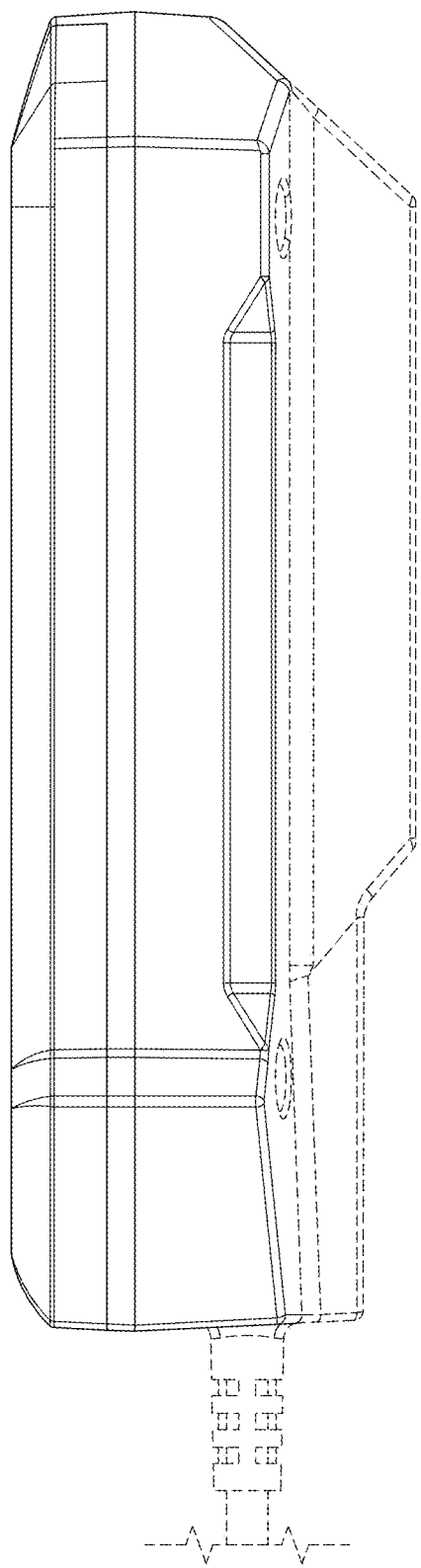
FIG. 4D
FIG. 4E

US 11,054,478 B1

MAGNETIC BATTERY TESTER HOUSING

CROSS-REFERENCE TO RELATED APPLICATION

This application claims the benefit of priority to U.S. Provisional Patent Application No. 62/752,864 entitled "Battery Testing Housing" and filed on Oct. 30, 2018, which is incorporated fully herein.

TECHNICAL FIELD

The present invention relates to a housing for a battery tester.

BACKGROUND

Battery testers may be utilized to determine the charge in a battery. However, during use, since users' hands may be gloved and/or dirty, battery testers often slip and are dropped. In addition, some may require users to remove gloves to use (e.g., due to touch screen features and/or small keys). Thus, a battery tester housing that is capable of being operated by users wearing or not wearing gloves and/or in which slipping (e.g., out of hands during use) is inhibited are needed.

SUMMARY

In various implementations, a battery tester housing may include a body that is capable of receiving components (e.g., electronic and/or mechanical components) that allow a battery to be tested. The body may include a presentation member, input member, holster, clamps, etc. The body may include one or more magnets that allow the battery tester to be coupled to a magnetic surface. The magnet(s) may not substantially interfere with the operations of the battery tester.

In various implementations, a battery tester may test a strength of a battery. The battery tester may include a housing that contains the components that are used to test a strength of the battery. The housing may include a first side, a second opposing side, a third side disposed between the first side and the second side of the housing, and a fourth side disposed between the first side and the second side of the housing. The housing may include at least two parts. A first part of the housing may receive components such as components for presentation to and/or receiving input from a user, such as touch screens, keypads, LCD screens, etc. A second part of the housing may be coupled to the first part of the housing (e.g., directly and/or indirectly). The second part may include an inner surface and an outer surface. The second part of the housing may include, in some implementations, a raised portion that extends from the outer surface. The second part may include magnet receiving members and magnets. The second part of the housing may include four or more magnet receiving members disposed on the inner surface in the raised portion and/or four or more magnets disposed in the four or more magnet receiving members. A first magnet and a second magnet may be disposed closer to the first side of the housing than the third magnet and the fourth magnet and/or the first magnet and the third magnet may be disposed closer to the third side than the second magnet and the fourth magnet. The housing may include a cavity disposed between the coupled first part and the second part. The cavity may extend into the inner surface of the raised portion extending from the outer surface and/or may receive the magnets and one or more components capable of testing a strength of a battery. The housing of the battery tester may be magnetic such that the battery tester can be coupled to a magnetic surface.

Implementations may include one or more of the following features. The housing of the battery tester may include one or more ports proximate the second side of the housing. Cables may extend through the ports and be coupled at a first end to clamps. Other ends of the cables may be coupled to components disposed in the cavity of the housing and configured to test a strength of a battery. The clamps may be configured to contact battery leads during testing of a strength of the battery. The magnet(s) of the housing may include neodymium magnets and/or any other appropriate magnet. At least a portion of the second part of the housing may include a rubberized outer surface. At least a portion of the second part of the housing may have a greater potential friction than the first part of the housing to inhibit movement of the battery tester when coupled to the magnetic surface. The housing may include a third part disposed between the first part and the second part when the first part and the second of the housing are coupled. The third part may be decorative and/or a gasket. The the first part and/or the second part may include one or more chamfered corners. The first part and/or the second part may include one or more beveled edges.

In various implementations, a battery tester housing may include a first side, a second opposing side, a third side disposed between the first side and the second side of the housing, and a fourth side disposed between the first side and the second side of the housing. The housing may include at least two parts, in some implementations. A first part of the housing may receive and/or be coupled to components capable of interacting with the user (e.g., presentation and/or input components). The second part of the housing may be coupled to the first part of the housing (e.g., directly and/or indirectly). The second part may include an inner surface and an outer surface. The second part of the housing may include four or more magnet receiving members disposed on the inner surface of the second part of the housing. Four or more magnets may be disposed in the four or more magnet receiving members. A first magnet and a second magnet may be disposed closer to the first side than a third magnet and a fourth magnet in the housing and/or the first magnet and the third magnet may be disposed closer to the third side of the housing than the second magnet and the fourth magnet disposed in the second part of the housing. The housing may include a cavity disposed between the coupled first part and the second part. The cavity may receive the magnets and one or more components capable of testing a strength of a battery. The housing of the battery tester may be magnetic such that the battery tester can be coupled to a magnetic surface.

Implementation may include one or more of the following features. The battery tester housing may include a raised portion that extends from the outer surface. The cavity may extend into the inner surface of the raised portion and/or the magnet receiving members may be disposed in the portion of the cavity that extends into the raised portion. The battery tester housing may include ports proximate the second side of the housing. Cables may extend through the ports and be coupled to clamps (e.g., at one end and be coupled to components of the battery tester that are capable of testing the strength of a battery on another end). The clamps may be configured to contact battery leads during testing of a strength of the battery. Magnets may include neodymium magnets and/or any other appropriate type of magnet. At least a portion of the second part of the housing may include a rubberized outer surface. At least a portion of the second part of the housing may have a greater potential friction than the first part of the housing to inhibit movement of the battery tester when coupled to the magnetic surface. The battery tester housing may include a third part disposed between the first part and the second part when the first part and the second of the housing are coupled. The third part may be decorative and/or may include gasket. The first part and/or the second part may include one or more chamfered corners. The first part and/or the second part may include one or more beveled edges. The length of the housing may be greater proximate the first side and the second side of the housing than at least a portion of the housing between the first side and the second side.

The details of one or more implementations are set forth in the accompanying drawings and the description below. Other features, objects, and advantages of the implementations will be apparent from the description and drawings.

BRIEF DESCRIPTION OF THE DRAWINGS

For a more complete understanding of this disclosure and its features, reference is now made to the following description, taken in conjunction with the accompanying drawings, in which:

FIG. 4D illustrates a side view of an implementation of the example housing of the battery tester, illustrated in FIG. 4A.

FIG. 4E illustrates a side view of an implementation of the example housing of the battery tester, illustrated in FIG. 4A.

Like references and/or reference symbols in the various drawings indicate like elements.

DETAILED DESCRIPTION

While historically commercial battery testers were large and wheeled from car to car for battery testing, in the past several years battery testers (e.g., for vehicles such as cars and boats) have been produced that are smaller in scale. However, as the size of the battery tester has decreased, so has the incidence of loss. Smaller battery testers may be more easily misplaced, dropped, and/or damaged when misplaced (e.g., left where a car and/or repair equipment may roll over the battery tester). A magnetic battery tester housing may increase user satisfaction by decreasing incidents of loss, increasing ease of use (e.g., since a user may couple the tester close by) and/or decrease incidental damage (e.g., due leaving a battery tester in a place it may be damaged such as the floor, near a car wheel, etc.).

In various implementations, a battery tester may include housing that is capable of receiving components (e.g., electronic and/or mechanical components) that are capable of testing the strength of a battery. The battery tester may include cables and/or clamps that contact the battery (e.g., leads of the battery) and operate with the other components to test the strength of a battery (e.g., of a vehicle). The housing may have one or more features that may facilitate operation of the battery tester, inhibit damage (e.g., by inhibiting dropping and/or slippage), and/or increase user satisfaction.

Figure 1A:
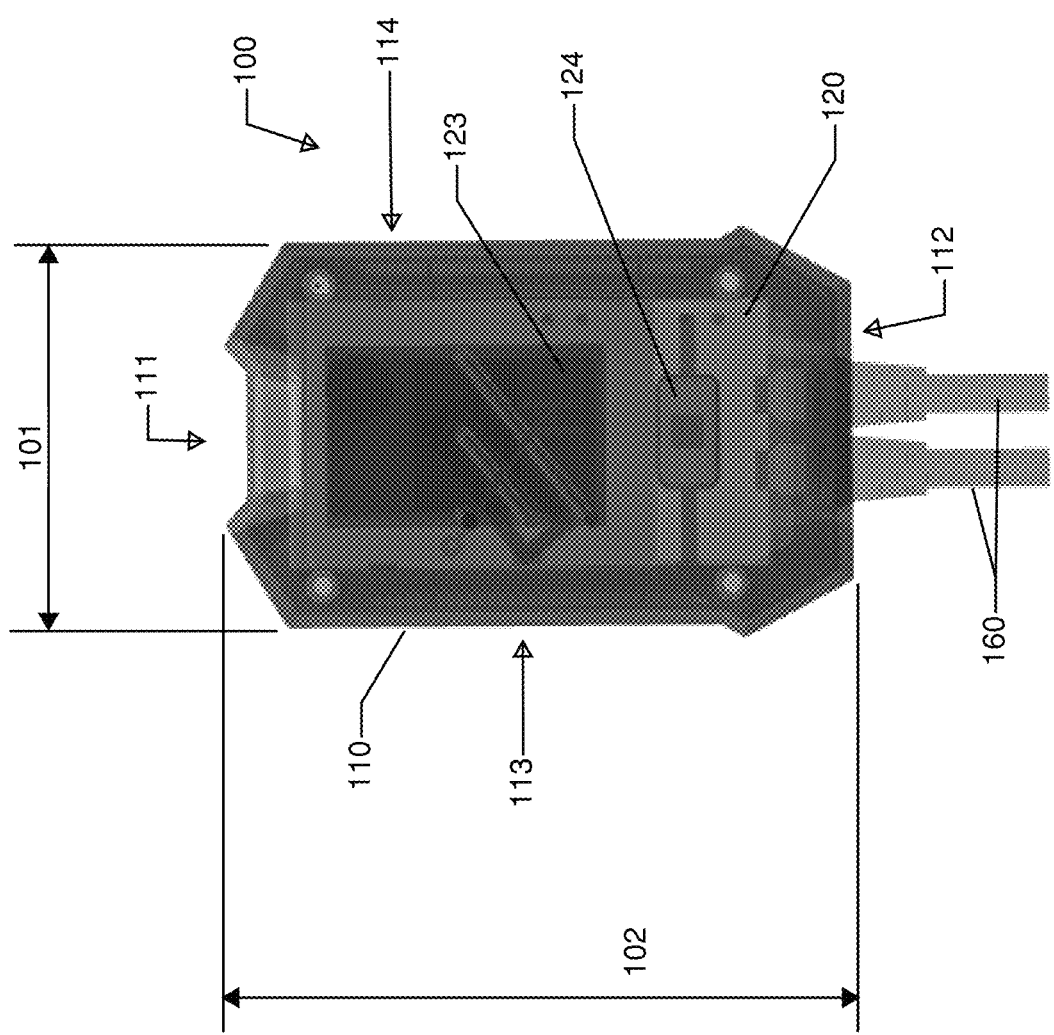
FIG. 1A illustrates a front view of an implementation of an example battery tester housing.
Figure 1B:
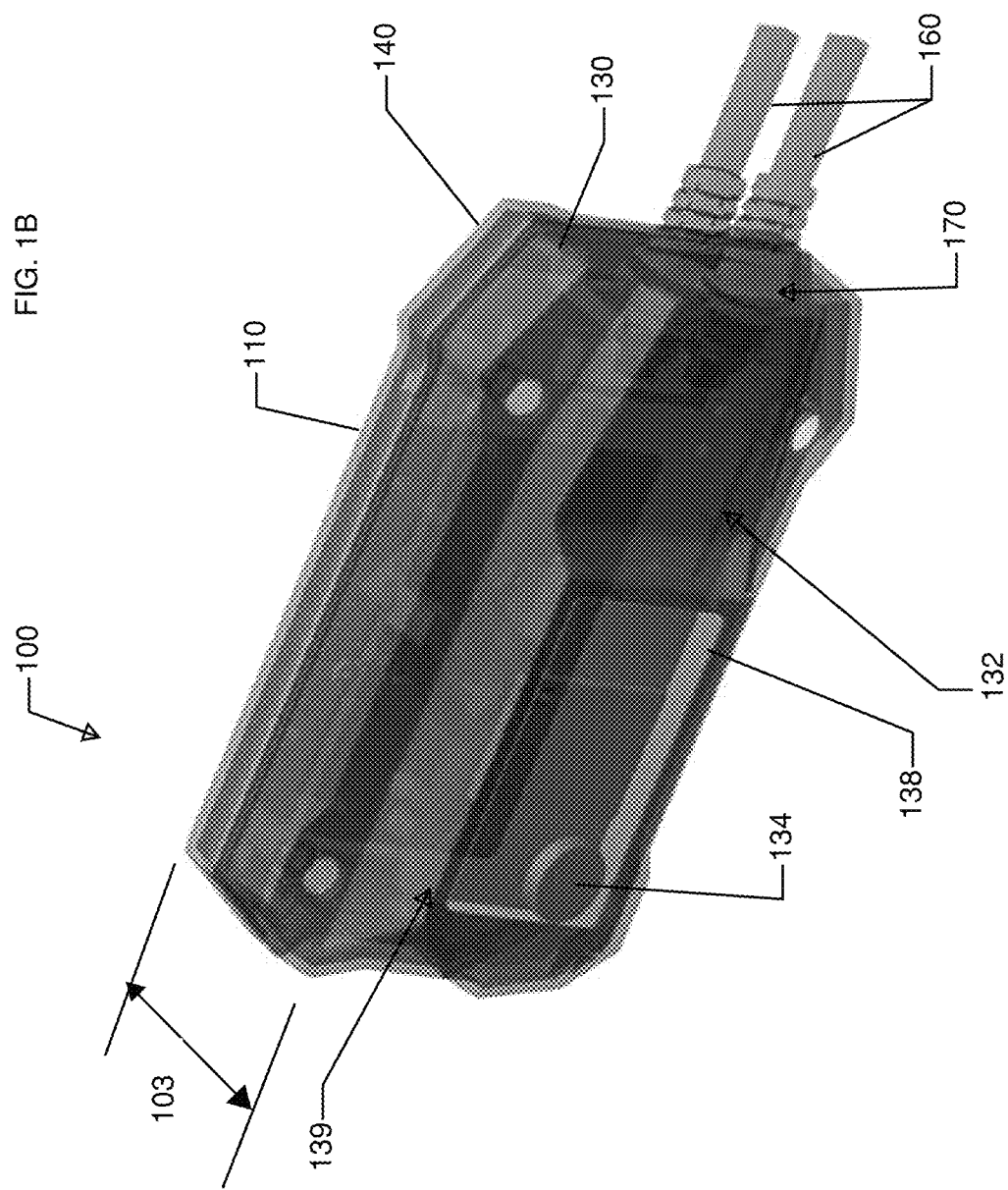
FIG. 1B illustrates a side perspective view of an implementation of the example battery tester housing illustrated in FIG. 1A.
Figure 1C:
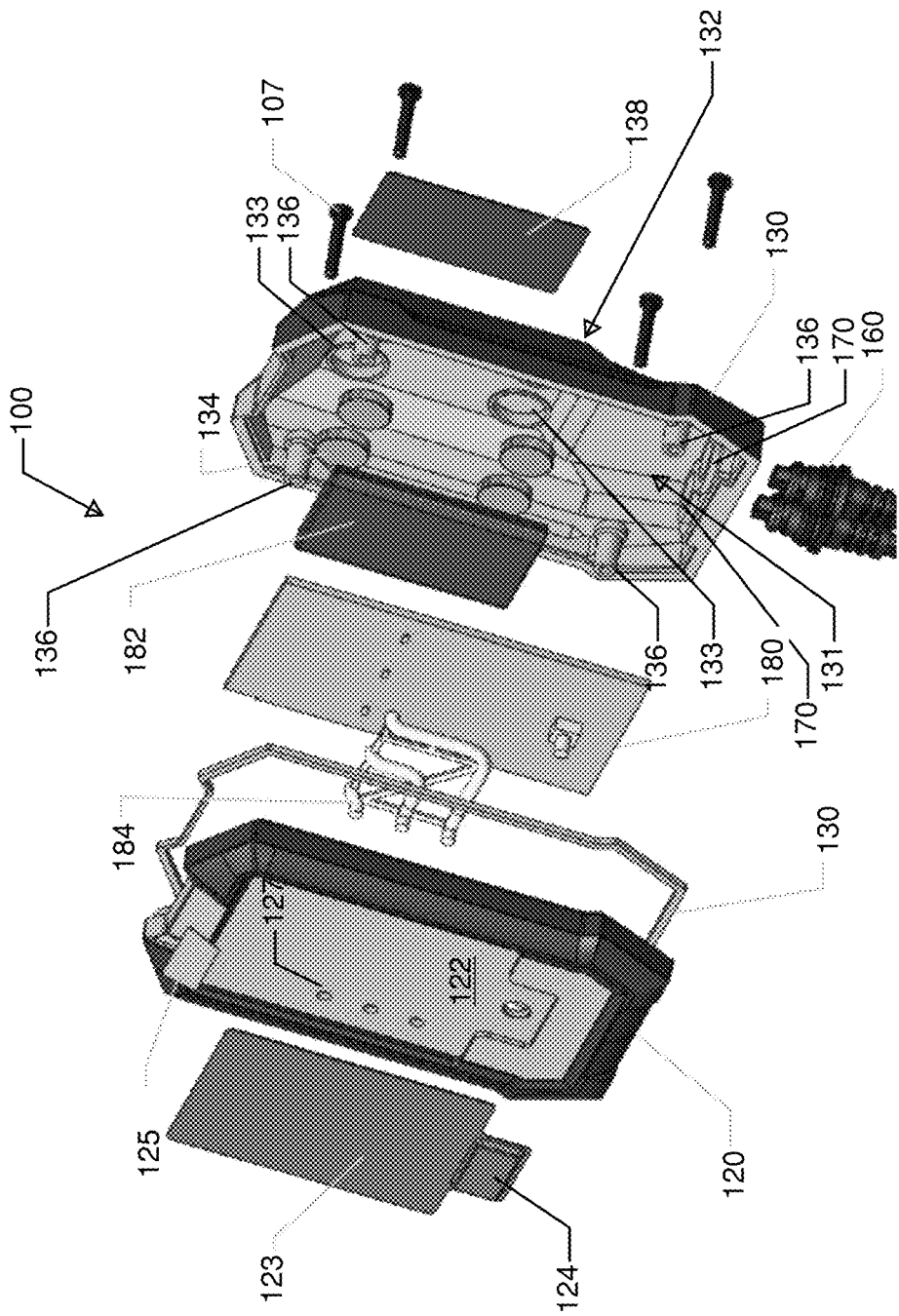
FIG. 1C illustrates an exploded view of an implementation of the example battery tester housing illustrated in FIG. 1A.
Figure 1D:
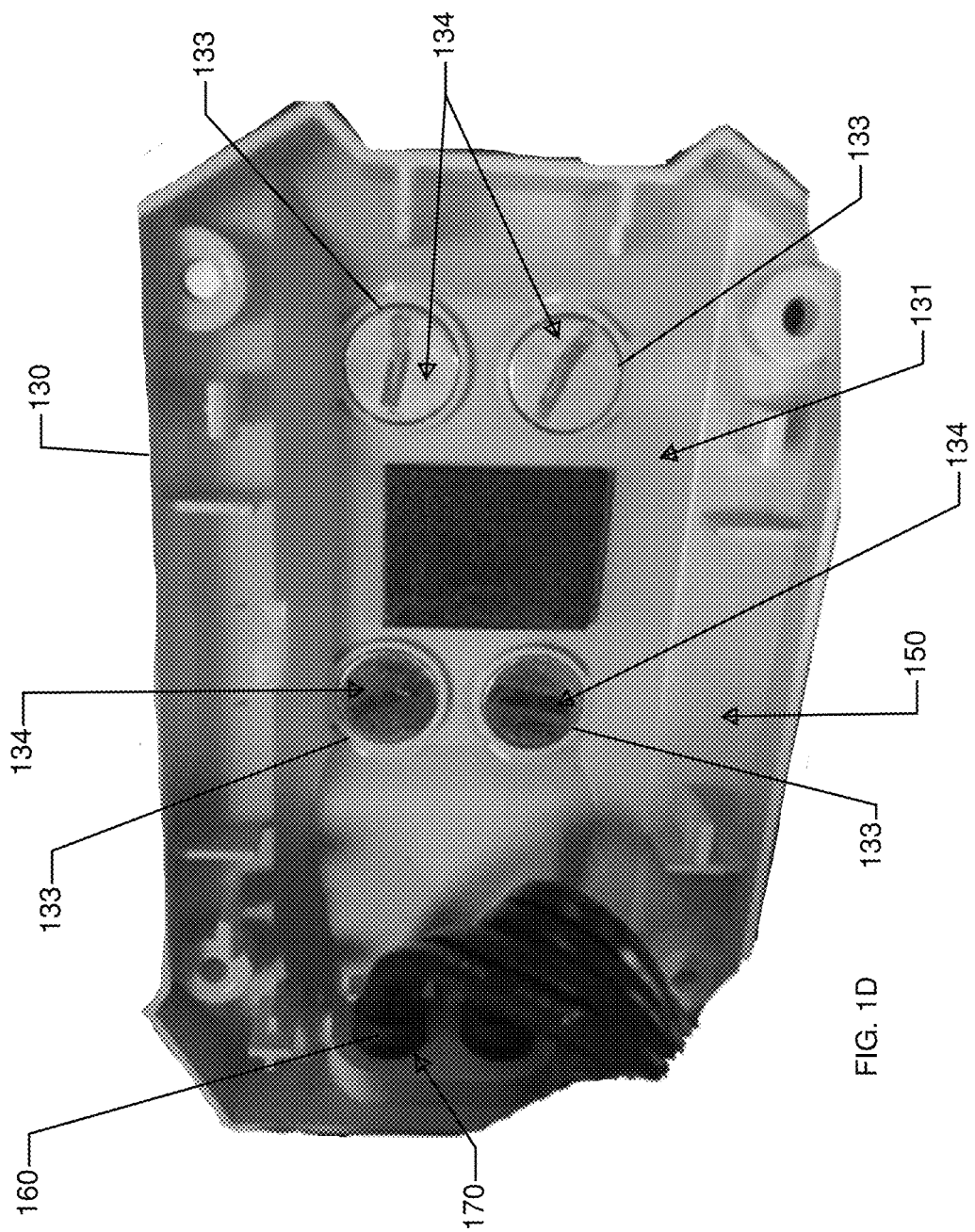
FIG. 1 D illustrates a cross-sectional view of a portion of the battery tester housing illustrated in FIG. 1A.

FIG. 1A illustrates a top view of an implementation of a battery tester and FIG. 1B illustrates a side perspective view of an implementation of a battery tester. FIGS. 1A-B are illustrated with a partially transparent top. FIG. 1C illustrates an exploded view of a simplified battery tester (e.g., components to test the battery may be simplified and/or vary) and FIG. 1D illustrates a portion the back part of the battery tester. The battery tester housing may be magnetic. Thus, the battery tester may be coupled (e.g., removably) to a magnetic surface. By allowing the battery tester to be coupled to the magnetic surface, as desired by a user, loss and/or damage to the battery tester or components thereof may be decreased and user satisfaction with the device may be increased. For example, the battery tester may be coupled to magnetic surfaces such as, but not limited to, vehicles or portions thereof, poles (e.g., in shops), carts, tool boxes, wearables (e.g., belts with magnetic surfaces, vests with magnetic surfaces, etc.), magnetic boards (e.g., white boards, peg boards, and/or chalk boards), other vehicle testing equipment, vehicle repair equipment, and/or any other appropriate magnetic surface. The magnetic battery tester may have a housing that is magnetic on one side and not magnetic on at least one other side (e.g., such that a predetermined side is visible and/or hidden to protect a predetermined side).

As illustrated, the battery tester 100 may include a housing 110. The housing may include a body with a length 101, a height 102, and a width 103. The body may have a first side 111, a second opposing side 112, a third side 113 disposed between the first side and the second side, and a fourth side 114 disposed between the first side and the second side.

The housing may include a body with at least a first part 120 (e.g., proximate a front of the battery tester) and a second part 130 (e.g., proximate the back of the battery tester). A third part 140 may be disposed between the first part 120 and the second part 150. The third part may at least partially circumscribe the housing of the battery tester as illustrated. The third part may be decorative (e.g., a stripe at least partially circumscribing the housing) and/or a functional. The third part 140 may be a gasket in some implementations. The third part may be integral with the first part 120 or the second part 130 or not included in some implementations. The first part 120 and the second part 130 may couple together (e.g., using any appropriate coupling members such as adhesive and/or fasteners 107) and a cavity 150 may be disposed between the first part and the second part.

The first part and/or the second part may include one or more chamfered corners. The first part and/or the second part may include one or more beveled edges. Chamfered corners and/or beveled edges may be decorative and/or functional. For example, the chamfered corners and beveled edges may be less prone to damage upon dropping (e.g., since sharp corners may not be bent upon dropping); may reduce the incidence of sharp corners of the housing causing damage to other people and/or items; etc.

In some implementations, the housing may include features to facilitate grip and inhibit dropping during use. For example, the length of the housing may be greater proximate the first side and the second side of the housing than at least a portion of the housing between the first side and the second side. The smaller portion between the first side and the second side may act as a gripping area to allow a user to more easily grip and/or retain the housing during use (e.g., as opposed to a housing with a more uniform cross-section along the height between the first side and the second side).

A first part 120 of the housing 110 of the battery tester 100 may include opening(s) and/or recess(es) 122 for presentation component(s) 123 and/or input component(s) 124. The presentation component may include a screen (e.g., touch screen and/or LCD screen), lighting components (e.g., LEDs), etc. An input device may include a keypad (e.g., arrow, enter, delete, alphanumeric, etc.), touch screen, etc. The presentation component and the input components may be separate pieces, unibody (e.g., a touchscreen capable of presenting information and/or allowing input of information), and/or pieces coupled together. In some implementations, a keypad may include arrows to allow use while wearing gloves (e.g., since many gloves may inhibit touchscreen operation; since accurate touching on touch screens may be difficult while wearing work gloves, and/or since fingers may be less flexible when wearing gloves). The keypad may be disposed below the screen to allow a user to view the screen while activating the keypad. The first piece of the housing may include a recess to receive a label 125 (e.g., including device name, brand, etc.), in some implementations.

The second part 130 of the housing 110 of the battery tester may include an inner side 131 and an opposing outer side 132. The inner side 131 of the second part 130 may include one or more magnet receiving members such as one or more magnet recesses 132 and/or magnet protrusions. A magnet receiving member may help retain a magnet in a closed housing (e.g., a lip of a magnet receiving member may inhibit a magnet from dislodging from a predetermined position) even when a bonding, between the magnet and the second part, such as adhesive, fails. Positioning the magnet in the cavity of the housing may extend the life of the magnetic battery tester since the magnet may still reside in the housing and be capable of coupling with magnetic surfaces even if the magnet becomes dislodged from an initial position. A magnet recess 132 may be configured to receive at least a portion of a magnet 134 (e.g., neodymium magnet). In some implementations, the body may include magnet protrusion(s) (e.g., a raised annular ring to receive magnet(s); protrusions that at least partially define a region in which a magnet is to be disposed; etc.) that are configured to receive at least a portion of a magnet. The magnet recess(es) and/or magnet protrusion(s) may define a region in which a magnet is to be disposed. The magnet recess(es) and/or magnet protrusion(s) may have a similar shape as magnet(s) to be disposed in the magnet recess(es) and/or magnet protrusion(s). The magnet recess(es) and/or magnet protrusion(s) may be larger in cross-sectional area (e.g., slightly larger, such as approximately 5% larger than a magnet size; and/or any appropriate size larger) than a cross-sectional area of a magnet, in some implementations.

In some implementations, the housing may not include magnet receiving members. The magnets may be coupled to an inner surface of the second part of the housing, in some implementations.

One or more magnets may be disposed in the second part of the housing to allow the housing to be magnetic and couple with magnetic surfaces (e.g., a surface to which a magnet is capable of coupling such as a surface that includes another magnet with the appropriate polarity, steel, iron, iron alloys, nickel, nickel alloys, cobalt, cobalt alloys, etc.). Magnet(s) may include neodymium magnets and/or any other appropriate type of magnet. In some implementations, at least 2 magnets may be disposed in the second part 130 of the housing 110. A first magnet may be disposed more proximate a third side than a second magnet in some implementations. In some implementations, four magnets may be disposed in the second part 130 of the housing 110. As illustrated, a first magnet and a second magnet may be more proximate the first side of the housing than the third magnet and the fourth magnet. The first magnet and the third magnet may be disposed more proximate a third side of the housing than the second magnet and the fourth magnet. A magnet may be a single magnet or multiple magnets (e.g., stacked).

In some implementations, the second part 130 of the housing 110 may include one magnet. For example, the magnet may have a shape similar to a plate. The plate magnet may be disposed approximately centrally between the third side and the fourth side of the second part of the housing.

In various implementations, the magnets may be coupled to the battery tester housing and/or disposed in the battery tester housing. For example, the magnets may be disposed in the magnet recesses and retained by contact with other components of the housing (e.g., when the first and second part are coupled together). As another example, the magnets may be coupled by any appropriate manner, such as bonding, gluing, affixing, protrusions (e.g., flexible arms) that extend to retain the magnet, cover plate(s), etc.

The number, type and/or size of magnet(s) disposed in the housing may be based on the size and/or weight of the battery tester or portions thereof (e.g., housing, cables, etc.) For example, for a battery tester housing less than approximately 10 inches in height and less than approximately 5 inches in length, four neodymium magnets may be utilized. As another example, the size, shape, and/or number of magnets may be selected such that the weight of the cables and clamps extending from the battery tester do not cause the magnetic battery tester to slide from a first position to a second position (e.g., more than approximately 5 inches away) and/or uncouple from a magnetic surface.

In some implementations, the position(s) of the magnet(s) may be selected such that the magnets are capable of coupling with a magnetic surface contacting the outer surface of the second part of the housing while not interfering with operations of the battery tester (e.g., magnetic interference with communication components, sensors, etc.). The magnets may be less than approximately 20 mm and/or less than approximately 16 mm from a communication component (e.g., Bluetooth), in some implementations. The magnet(s) may be disposed less than approximately 3 mm or less than approximately 2.5 mm from the back outer surface. The magnet(s) may not interfere with operations of the programmable logic disposed in the cavity. In some implementations, a shield may not be utilized between the programmable logic and the magnets.

In some implementations, at least a portion of the outer surface of the second part may include a material, texture, and/or feature to facilitate retention of the magnetic battery tester on a magnetic surface (e.g., work cart, vehicle, pole, I-beam, etc.). For example, at least a portion may be rubberized. The rubberized outer surface or portion thereof may aid retention of the magnetic battery tester at a position on a magnetized surface and/or inhibit damage to the magnetic surface to which the battery tester couples. As another example, at least a portion of the second part may have greater friction than at the first part such that sliding of the second part is inhibited when coupled to a magnetic surface (e.g., the potential friction for static friction of at least a portion of the second part is greater than the potential friction for static friction of the first part). For example, the plastic may have a tackiness, in some implementations. Thus, the second part or portion thereof (e.g., rubberized portion) and the magnets may retain the battery tester at approximately a first position (e.g., the position to which it was initially coupled) rather sliding from a first position to a second position. The use of a frictionally retaining outer surface or portion thereof may allow the use of weaker magnets than if a smooth or slippery outer surface was utilized, which may increase user enjoyment of the device (e.g., since it may not be difficult to remove the magnetic battery tester from a magnetized surface if a frictionally retaining outer surface is used rather than a stronger magnet to retain a battery tester in a first position).

The outer surface may include labels, instructions, and/or other information on a panel 138.

In some implementations, the second part of the housing may include one or more feet extending from the second part. Feet may include a rubberized portion (e.g., to inhibit scratching and/or damage of magnetic surfaces to which the battery tester couple) and act as the rubberized portion of the outer surface of the second part to retain a couple battery tester at approximately a first position. In some implementations, the height of the feet may increase the distance the magnetic forces need to travel to interact with a magnetic surface and the strength and/or number of magnets may be increased.

The cavity 140 of the battery tester housing may include one or more components of the battery tester to facilitate testing the strength of the battery. For example, components such as lighting a programable logic component 180 (e.g., PCB), battery (e.g., to operate lights and programmable logic component), communication component(s) (e.g., Bluetooth, Wireless, etc.), and/or any other appropriate component may be disposed in the cavity of the housing 110. The battery tester may include lighting components 184 at least partially disposed in the cavity. The lighting components 184 may extend through orifices 127 in the first part of the housing and/or be visible through the first part of the housing. The lighting components may provide signals to a user, such as a signal related to a strength of the battery (e.g., low, needs charging, good strength).

The battery tester may include clamps coupled via cables 160 to the housing. The housing 110 may include ports 170 through which cables at least partially pass through to couple with other components of the battery tester (e.g., components to facilitate battery strength testing). A first end of the cables may be coupled to one or more components in the housing and the second end of the cables may be coupled to clamps to allow battery testing. The clamps may couple with and/or contact a portion of the battery (e.g., leads of the battery) to allow other components of the battery tester to determine the strength of the battery. In some implementations, wireless clamps may be utilized. For example, the housing may be capable of coupling with a set of clamps via a communication interface to operate together to test a strength of a battery.

In some implementations, the battery tester may include holsters, in which clamps (e.g., for coupling with a battery to be tested) may be disposed. The holsters may be disposed, in some implementations, on the second part of the housing and/or on sides of the housing. The holster(s) may be single piece, in some implementations. The holster(s) may be removable members. For example, an outer surface of the second part may include one or more holster recesses that are capable of receiving protrusion(s) disposed on an outer surface of one or more holsters to couple the holster and the second part. The holster cup(s) may be removable and/or replaceable in some implementations. Thus, as the holster cup(s) break (e.g., from dropping, repetitive stress due to insertion of the clamps, etc.), holster cup(s) may be replaced. The battery tester may be disposable in a base. The base may have any appropriate size and/or shape. The base may or may not include arms (e.g., to ease gripping the base). The base may be couplable to various surfaces such as walls.

In some implementations, the battery tester may include any appropriate communication interfaces to communicate with one or more other computing devices to determine a strength of a battery, present a strength of a battery, etc.

Although a particular shape and configuration of the housing has been illustrated, other shapes and/or configurations may be utilized, as appropriate. The housing of the battery tester may be any appropriate shape and/or size. The housing may include any appropriate material and/or any appropriate opacity. The hardness of at least a portion of the housing may be selected to resist wear and/or damage from accidental drops. The surface hardness of at least a portion the housing may be at least approximately 65.

The housing may include one or more chamfered and/or beveled corners. In some implementations, one or more edges may be beveled. As illustrated, the chamfer and/or bevel may be similar and/or complementary on the first and the second parts of the housing.

In various implementations, the housing may be configured to facilitate holding the battery tester in a hand during use and/or transport. As illustrated, the first side and/or second side of the housing may be larger than an area between the first side and the second side. In some implementations, the outer surface of the second part may include a raised surface 139 between the third side and the fourth side. The raised surface may more easily fit into a curved hand while a user holds the device than an approximately planar outer surface of a second part of the housing. The magnets may be disposed in the portion of the cavity corresponding to the raised surface to allow weaker and/or less magnets to be used than if the magnets were disposed in the surfaces adjacent the raised surface. In some implementations, the raised surface may be proximate the first side and/or may not extend to the second side of the housing. In some implementations, the raised surface may be used instead of sticky feet, straps, and/or tacky housing material. The raised surface may facilitate gripping of the housing as well as and/or better than these options. Additionally, unlike tacky surfaces, feet, and/or straps, the raised surface may be more durable (e.g., since it does not need to be replaced like lost feet, broken straps; and/or washed to restore tackiness, etc.).

As illustrated, FIGS. 1A-1C illustrate an implementation of an example battery tester system. As illustrated the battery tester system may include a battery tester and a base in which the battery tester may reside (e.g., during use and/or when not in use).

Figure 2A:
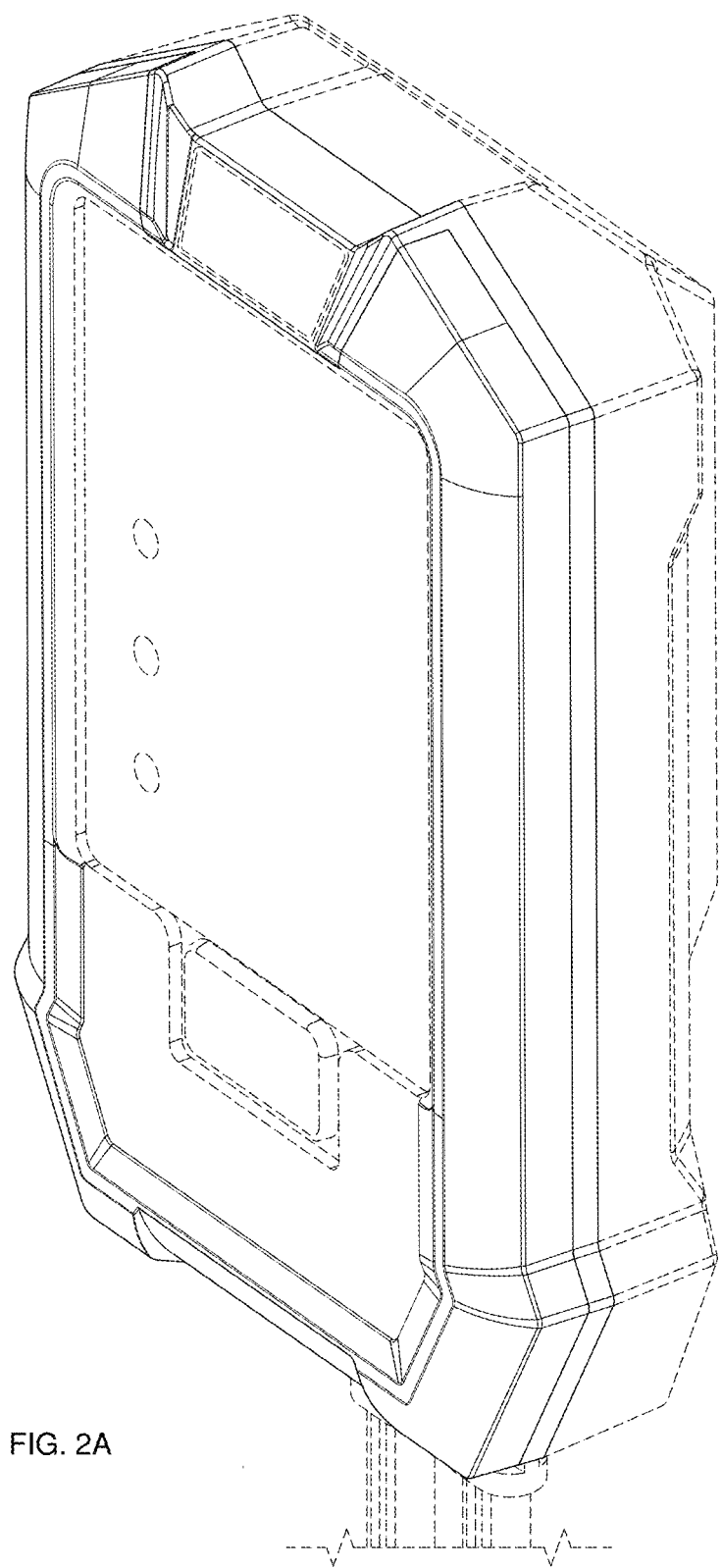
FIG. 2A illustrates a front perspective view of an implementation of an example housing of a battery tester.
Figure 2B:
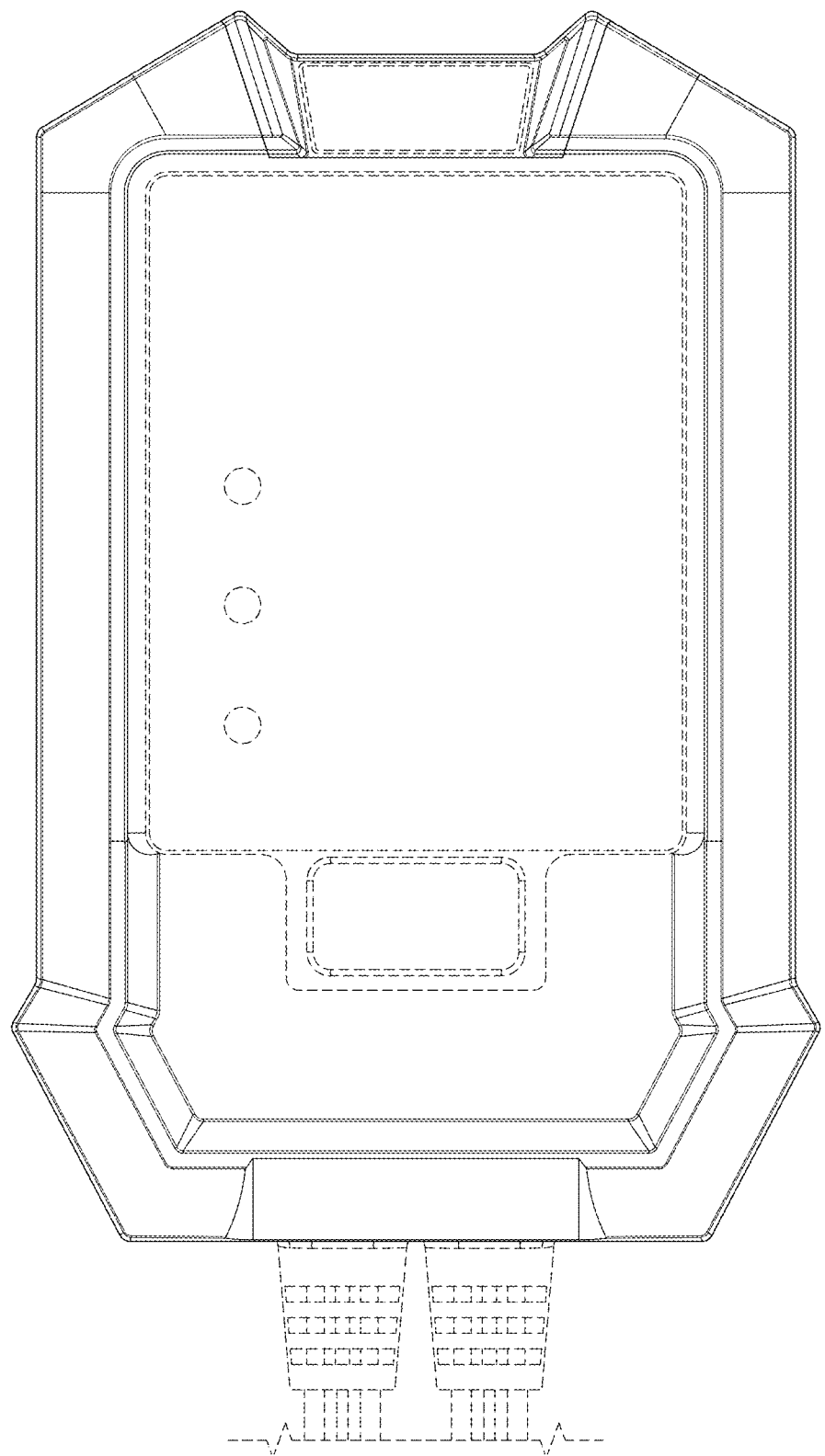
FIG. 2B illustrates a front view of an implementation of the example housing of the battery tester, illustrated in FIG. 2A.
Figure 2C:
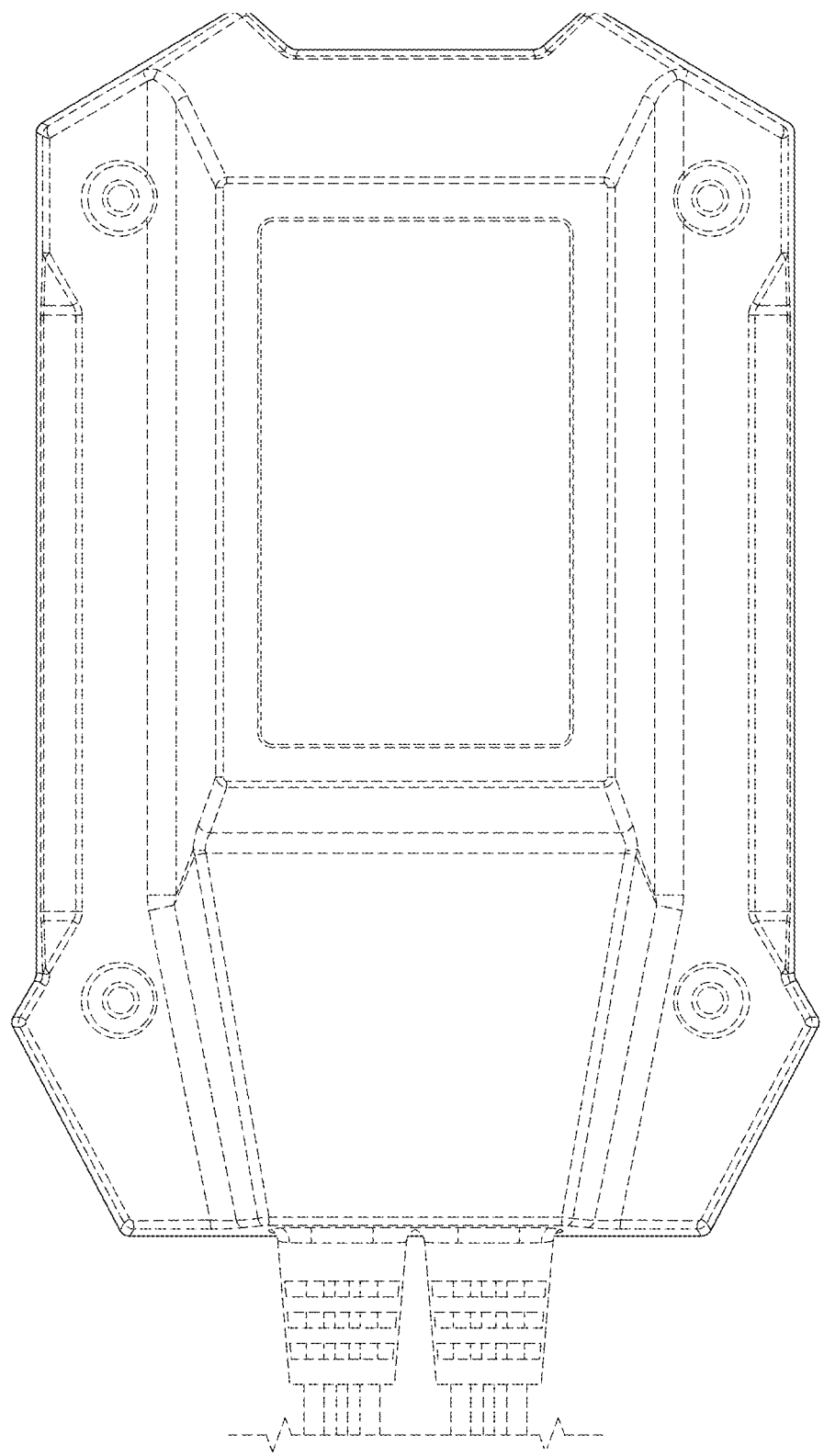
FIG. 2C illustrates a back view of an implementation of the example housing of the battery tester, illustrated in FIG. 2A.
Figure 2D:
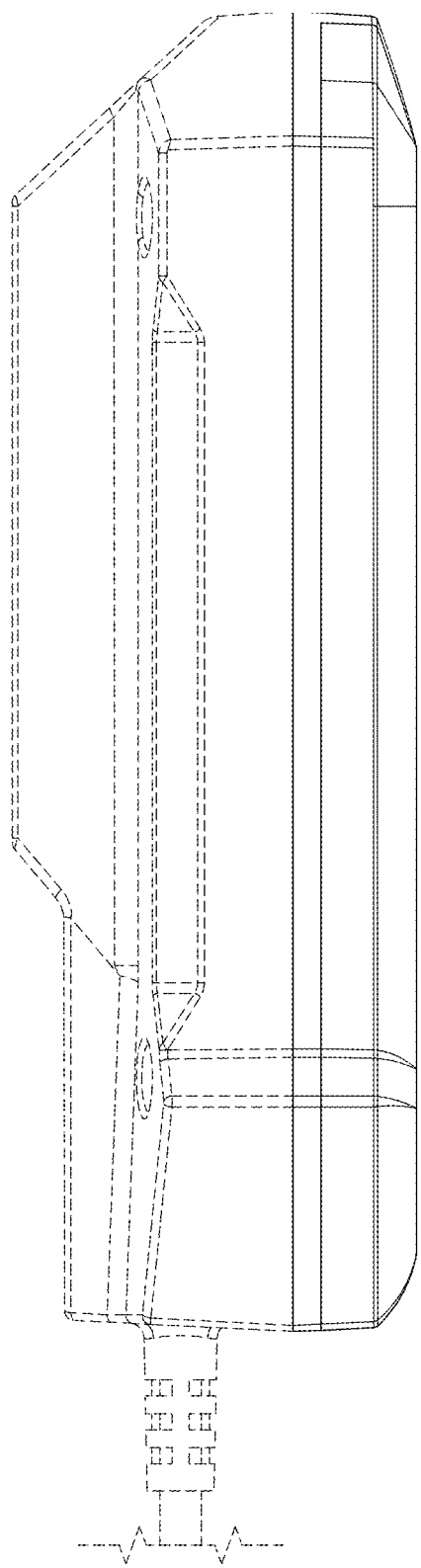
FIG. 2D illustrates a side view of an implementation of the example housing of the battery tester, illustrated in FIG. 2A.
Figure 2E:
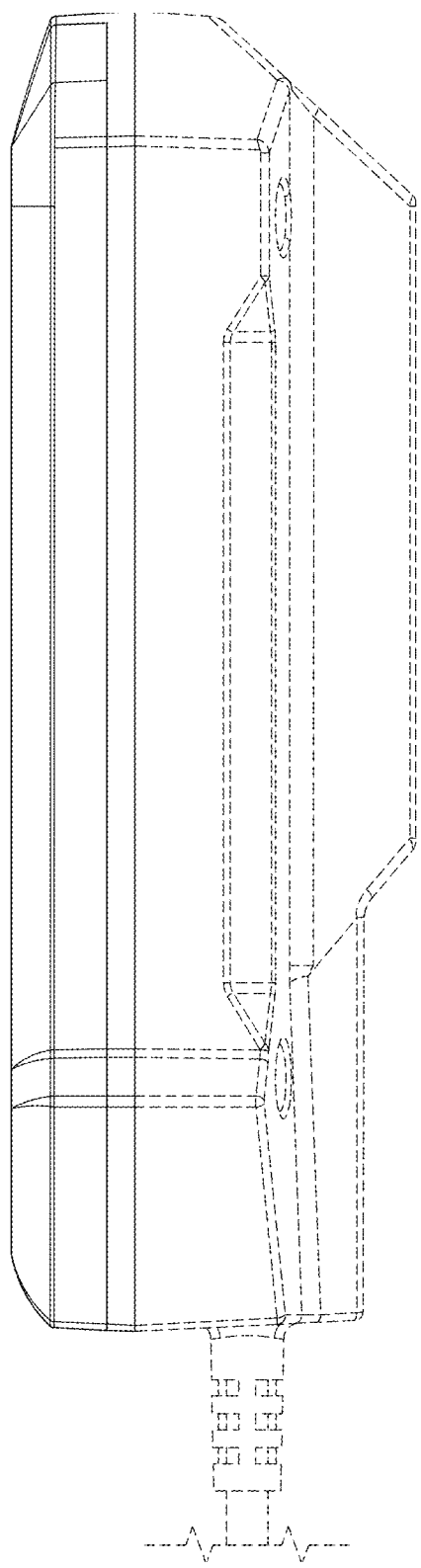
FIG. 2E illustrates a side view of an implementation of the example housing of the battery tester, illustrated in FIG. 2A.
Figure 2F:
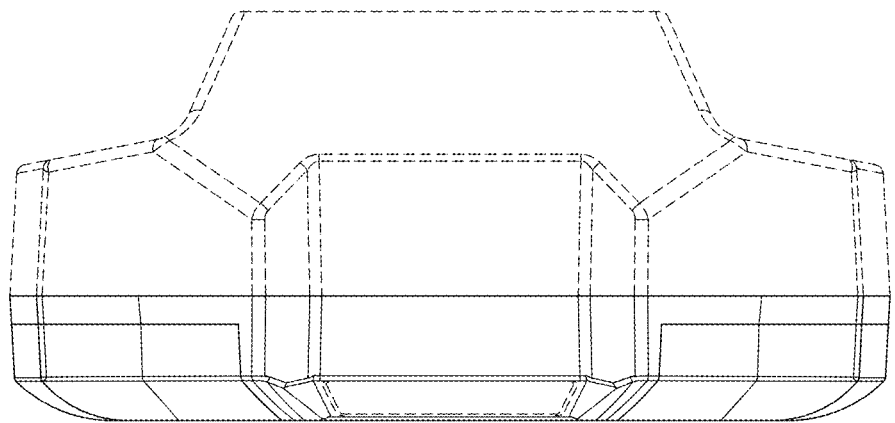
FIG. 2F illustrates a top view of an implementation of the example housing of the battery tester, illustrated in FIG. 2A.
Figure 2G:
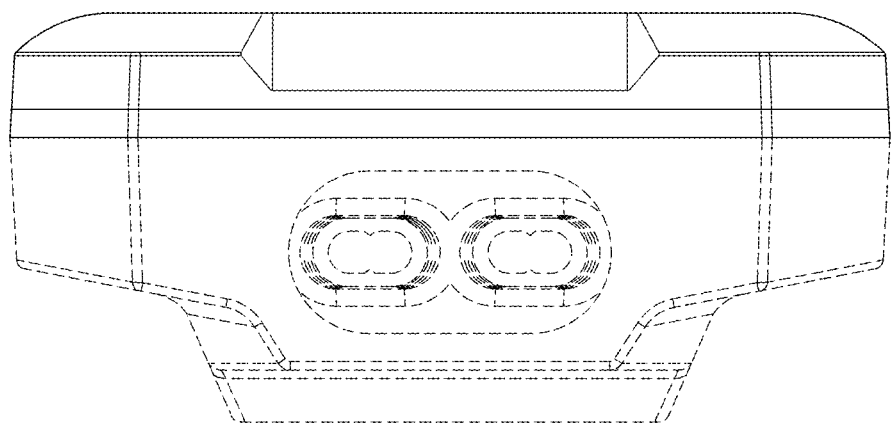
FIG. 2G illustrates a bottom view of an implementation of the example housing of the battery tester, illustrated in FIG. 2A.
Figure 2H:
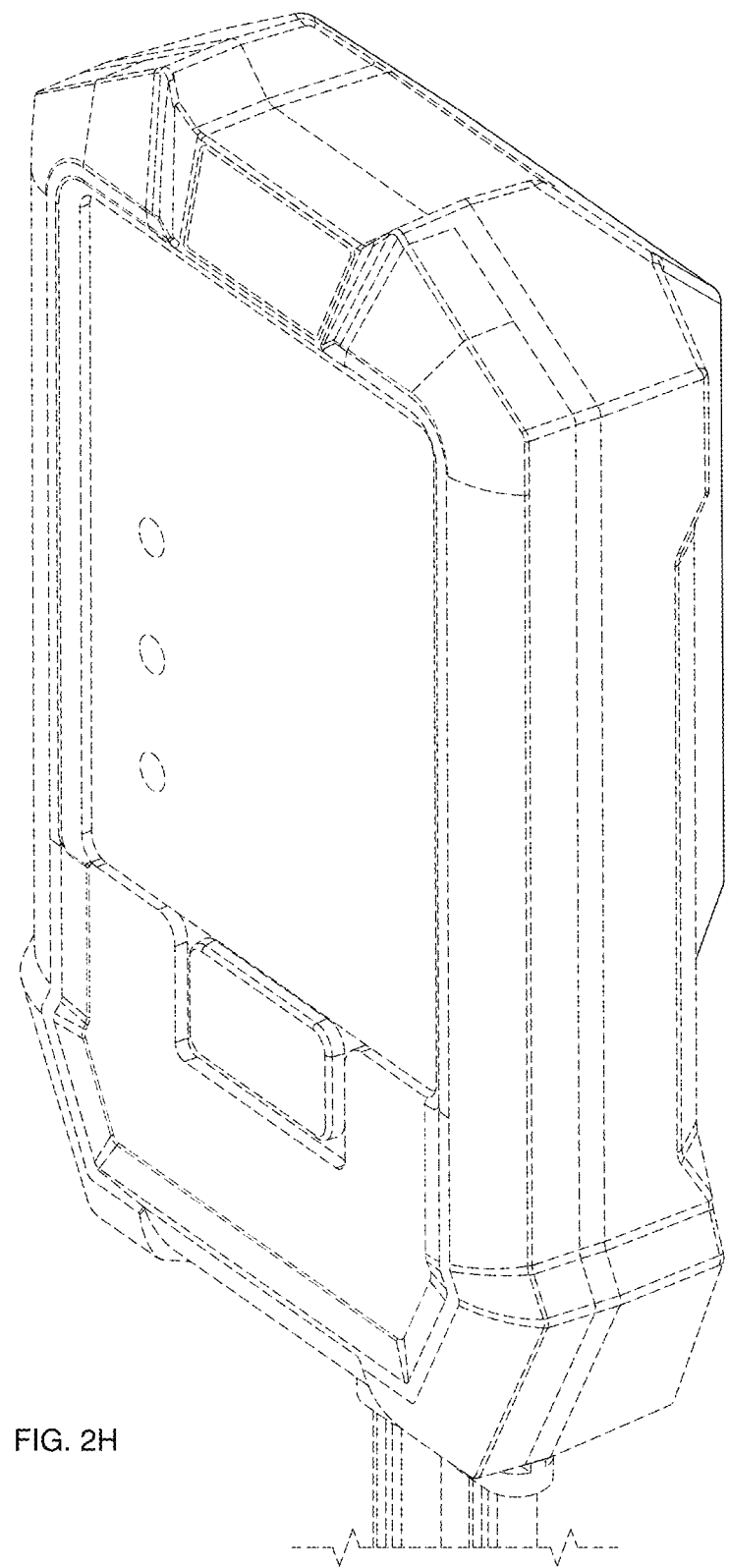
FIG. 2H illustrates a front perspective view of an implementation of an example housing of a battery tester.
Figure 2I:
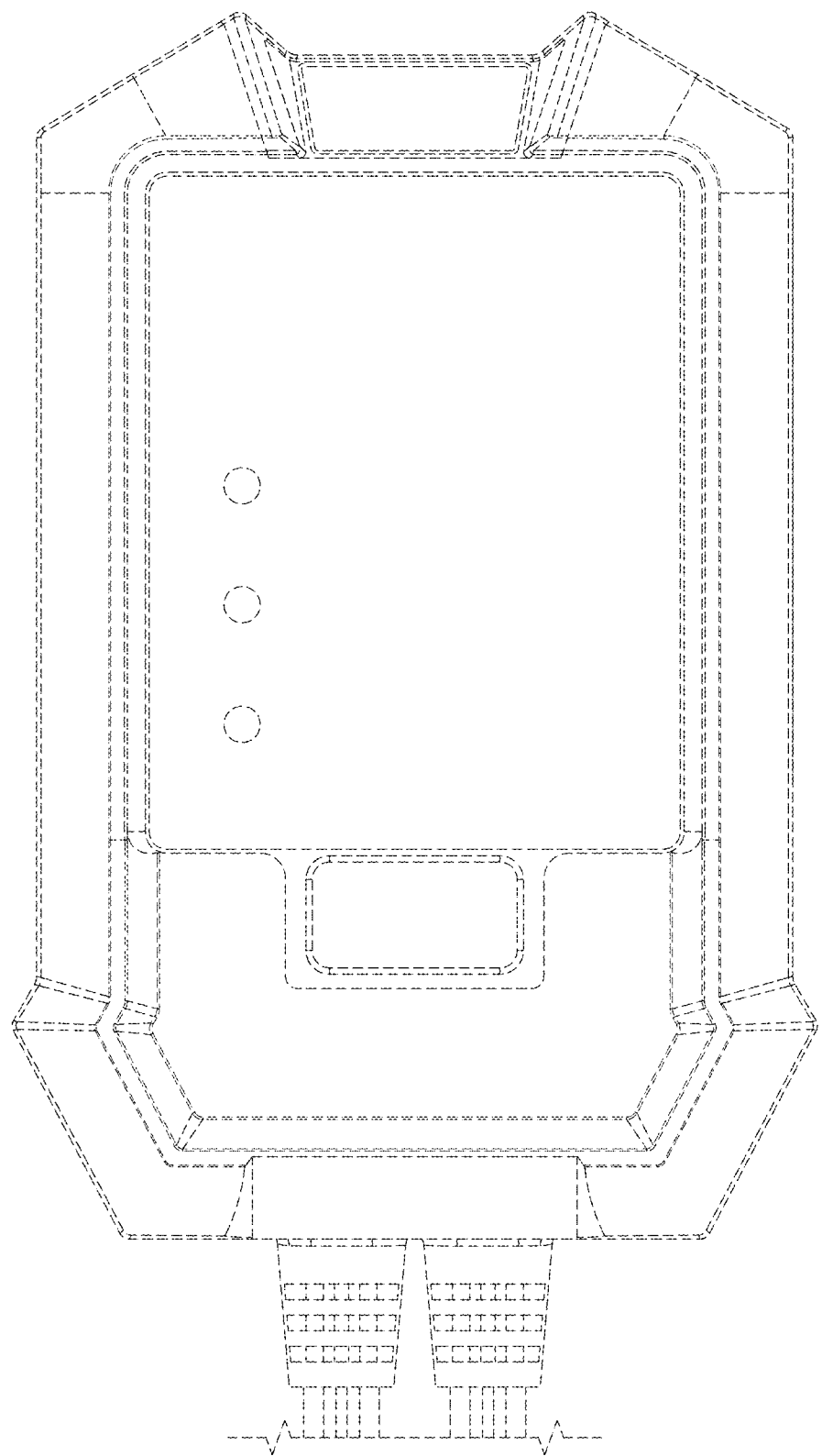
FIG. 2I illustrates a front view of an implementation of the example housing of the battery tester, illustrated in FIG. 2H.
Figure 2J:
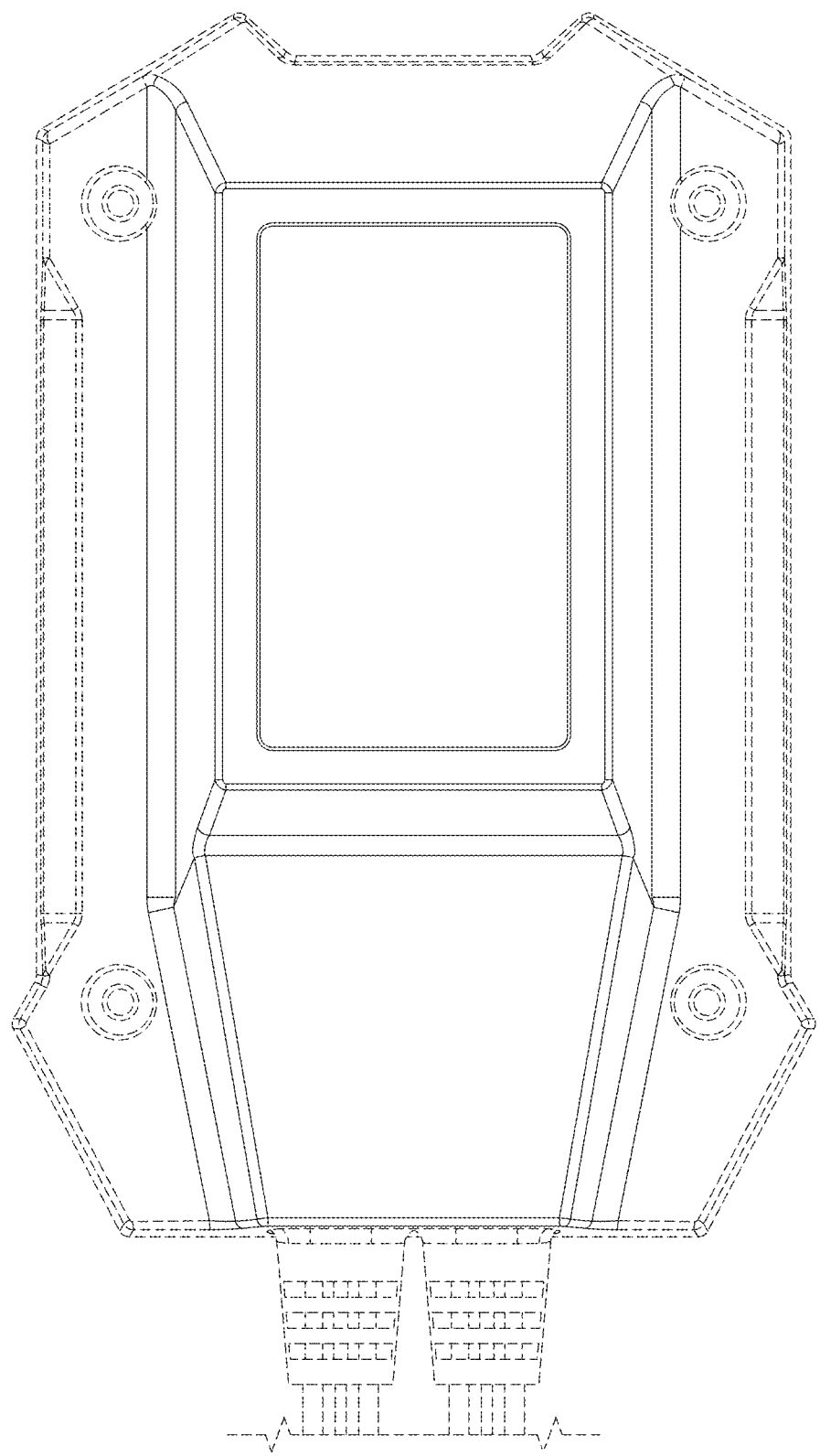
FIG. 2J illustrates a back view of an implementation of the example housing of the battery tester, illustrated in FIG. 2H.
Figure 2K:
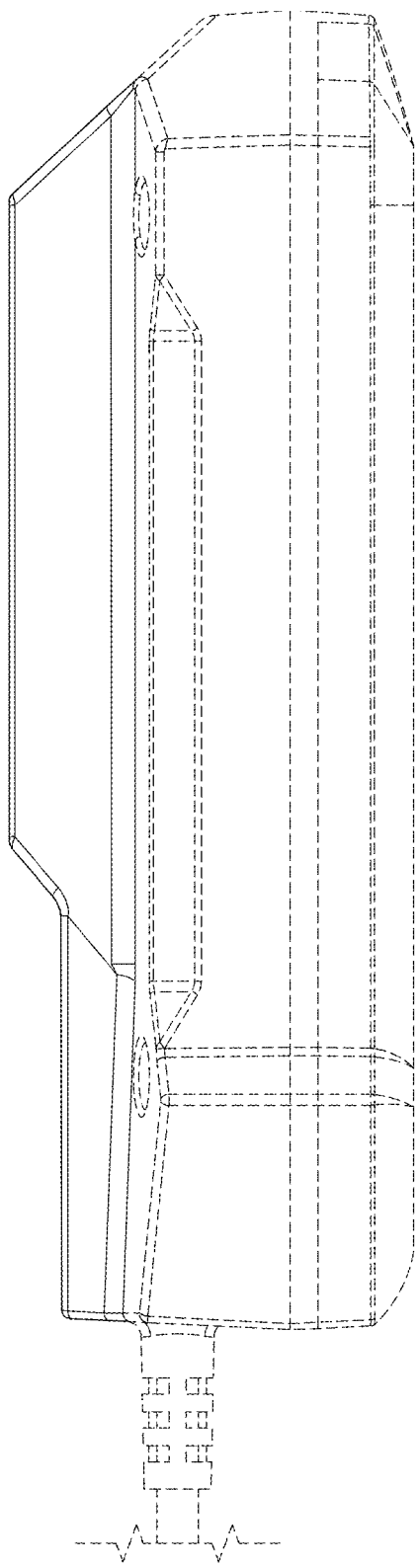
FIG. 2K illustrates a side view of an implementation of the example housing of the battery tester, illustrated in FIG. 2H.
Figure 2L:
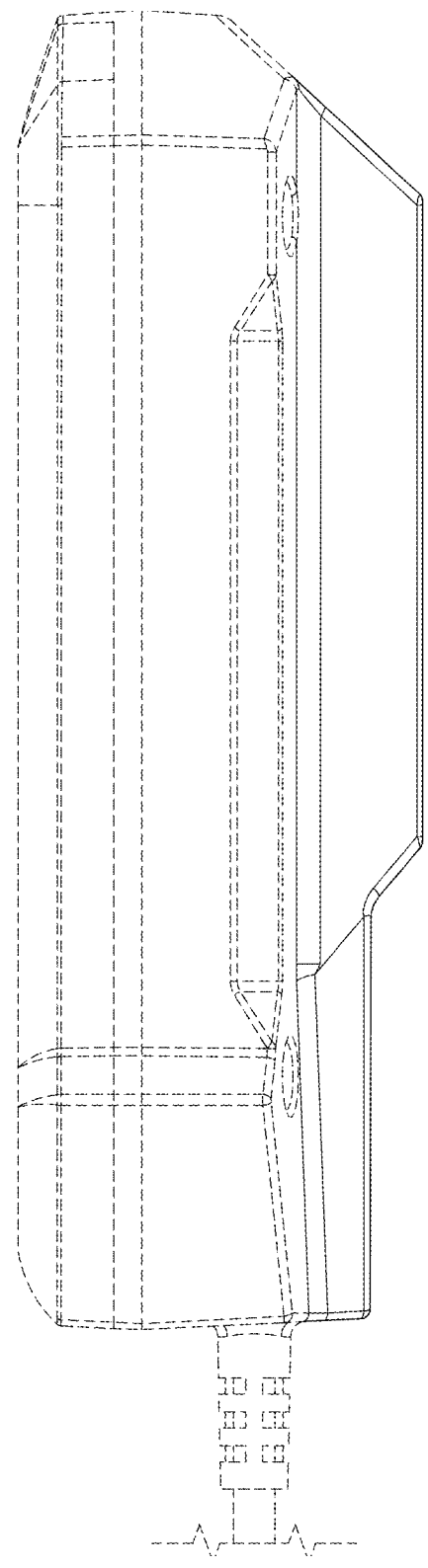
FIG. 2L illustrates a side view of an implementation of the example housing of the battery tester, illustrated in FIG. 2K.
Figure 2M:
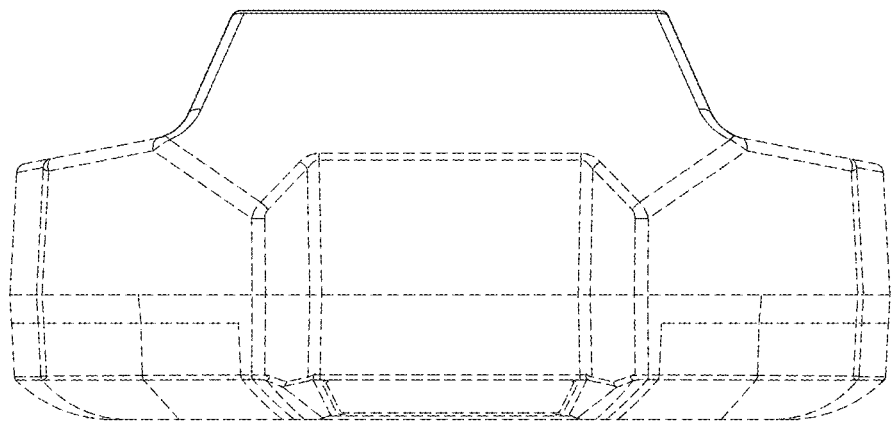
FIG. 2M illustrates a top view of an implementation of the example housing of the battery tester, illustrated in FIG. 2H.

FIGS. 2A-2S illustrate an implementation of an example battery tester and portions thereof. As illustrated, a camera and/or other type of sensor may be disposed on the second opposing side of the battery tester. The camera and/or other type of sensor may be disposed in any appropriate position on the battery tester. The camera and/or other type of sensor may be disposed between the holster cups. In some implementations, the camera and/or other type of sensor may not be inhibited from obtaining images and/or other readings when the clamps are disposed in the holster. During use, since the clamps may be coupled to the battery and may not be disposed in the holster, the clamps and/or cabling from the wire may not inhibit image capture and/or sensor readings (e.g., since the cabling may exit the housing of the battery testing proximate a bottom of the tester and/or below the holster). The position of the camera and/or other type of sensor on the battery tester between the holster may be selected such that when a user is holding the battery tester the camera and/or sensor may not be blocked by fingers and/or palms that hold the battery tester (e.g., since the user may hold the battery tester in the middle and/or below the holster). Thus, inadvertently erroneous readings may be inhibited via placement between the holster.

Figure 2N:
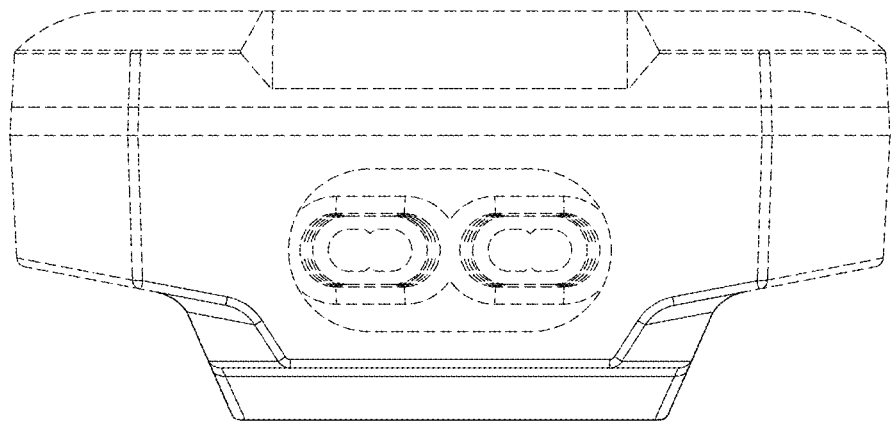
FIG. 2N illustrates a bottom view of an implementation of the example housing of the battery tester, illustrated in FIG. 2H.

FIGS. 2A-2N illustrate an implementation of an example battery tester housing and portions thereof. The housing may include two or more parts. In some implementations, the housing includes magnets to operate as a magnetic battery tester housing as described herein.

Figure 3A:
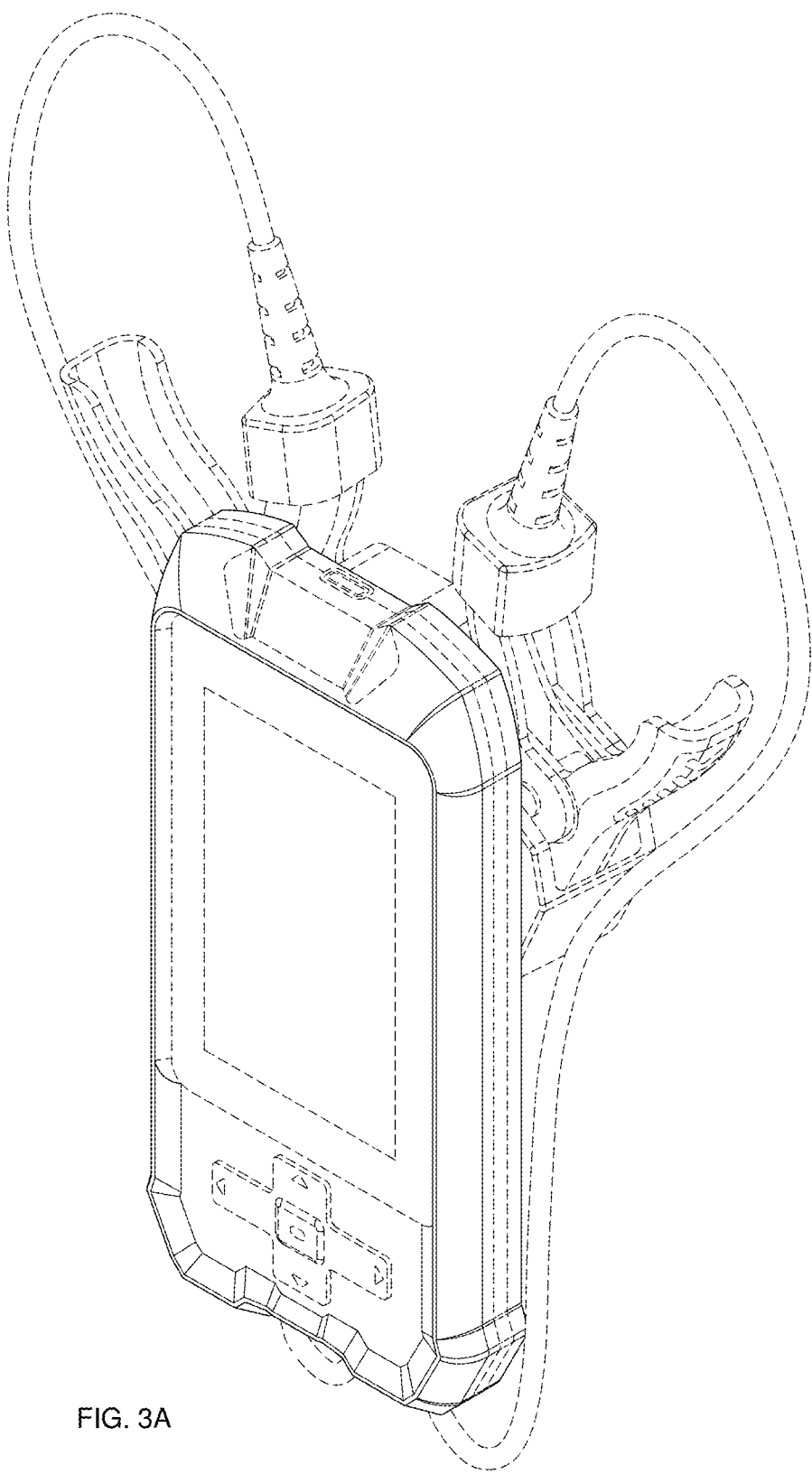
FIG. 3A illustrates a front perspective view of an implementation of an example housing of a battery tester.
Figure 3B:
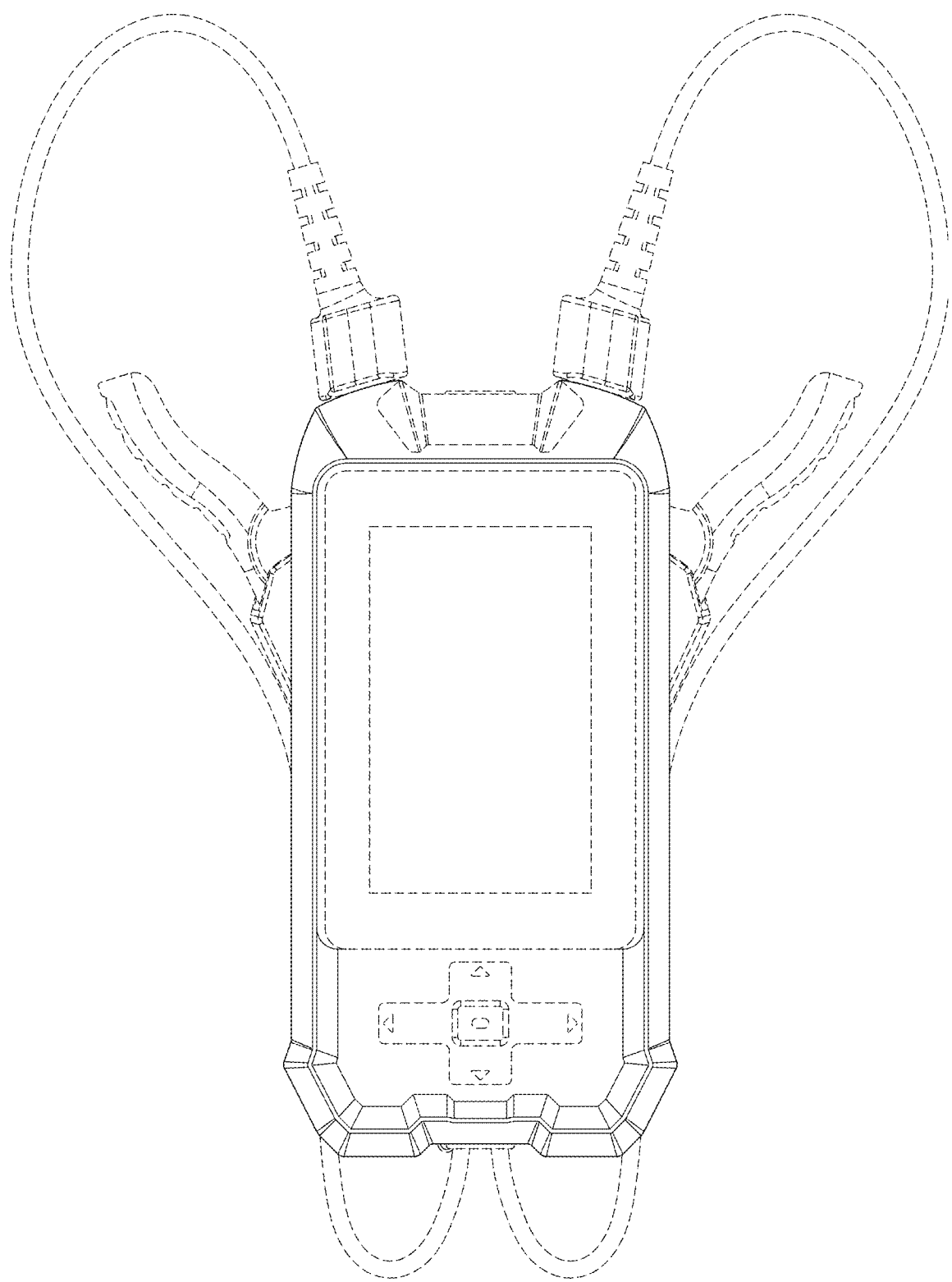
FIG. 3B illustrates a front view of an implementation of the example housing of the battery tester, illustrated in FIG. 3A.
Figure 3C:
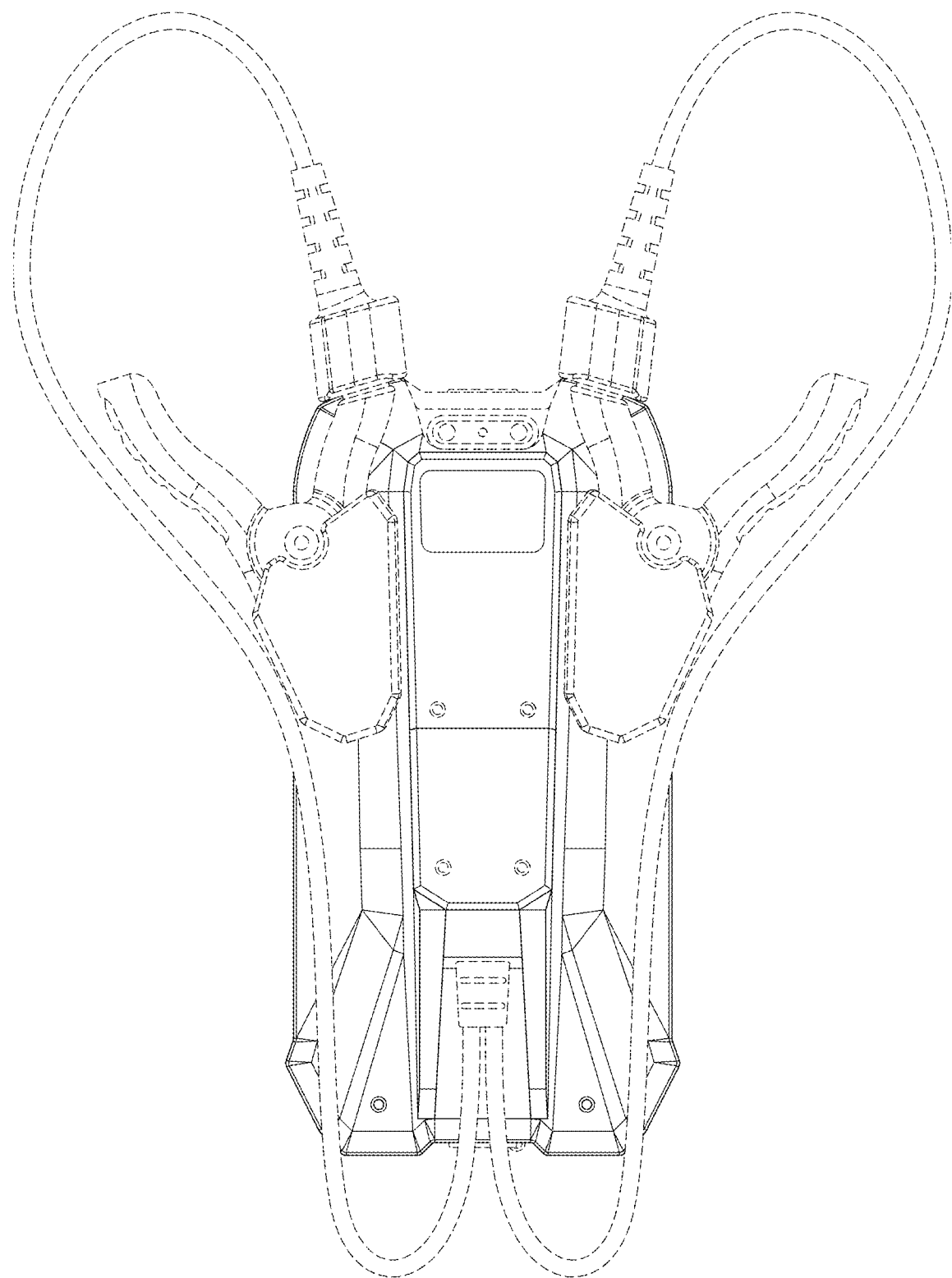
FIG. 3C illustrates a back view of an implementation of the example housing of the battery tester, illustrated in FIG. 3A.
Figure 3D:
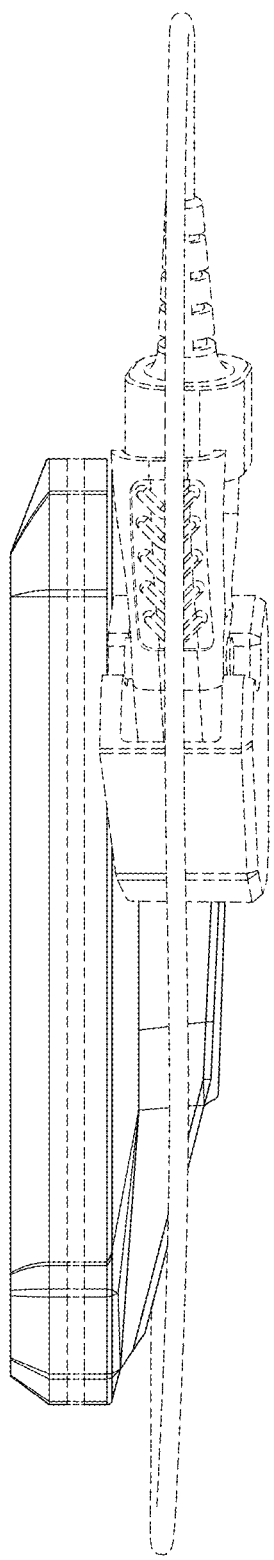
FIG. 3D illustrates a side view of an implementation of the example housing of the battery tester, illustrated in FIG. 3A.
Figure 3E:
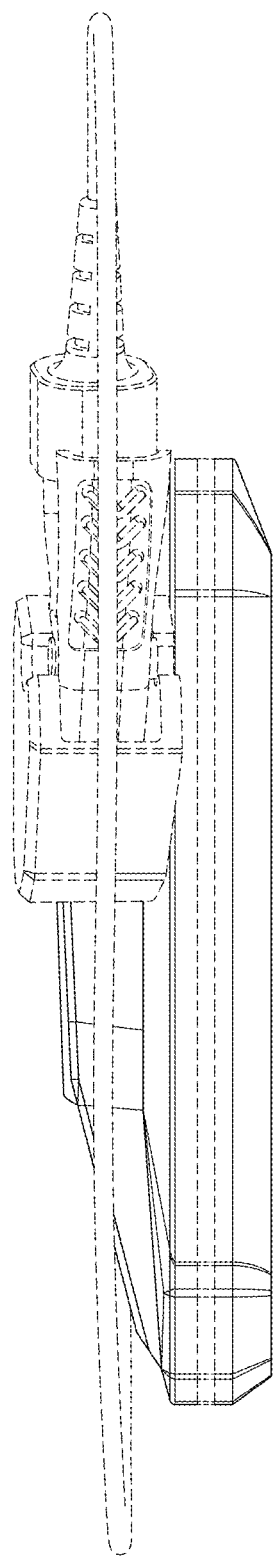
FIG. 3E illustrates a side view of an implementation of the example housing of the battery tester, illustrated in FIG. 3A.
Figure 3F:
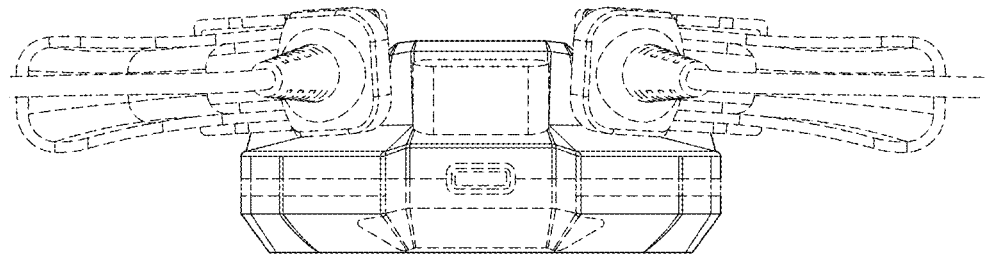
FIG. 3F illustrates a top view of an implementation of the example housing of the battery tester, illustrated in FIG. 3A.
Figure 3G:
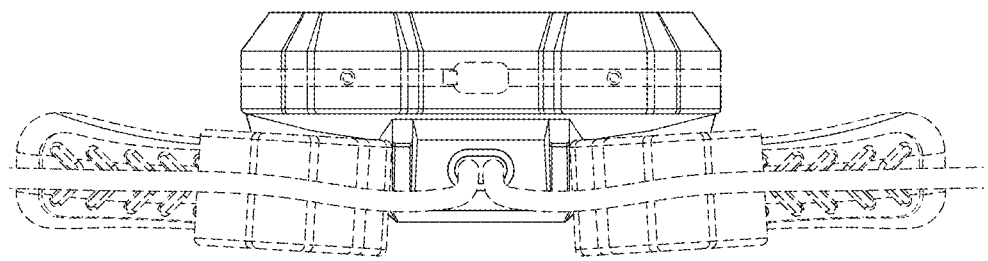
FIG. 3G illustrates a bottom view of an implementation of the example housing of the battery tester, illustrated in FIG. 3A.
Figure 3H:
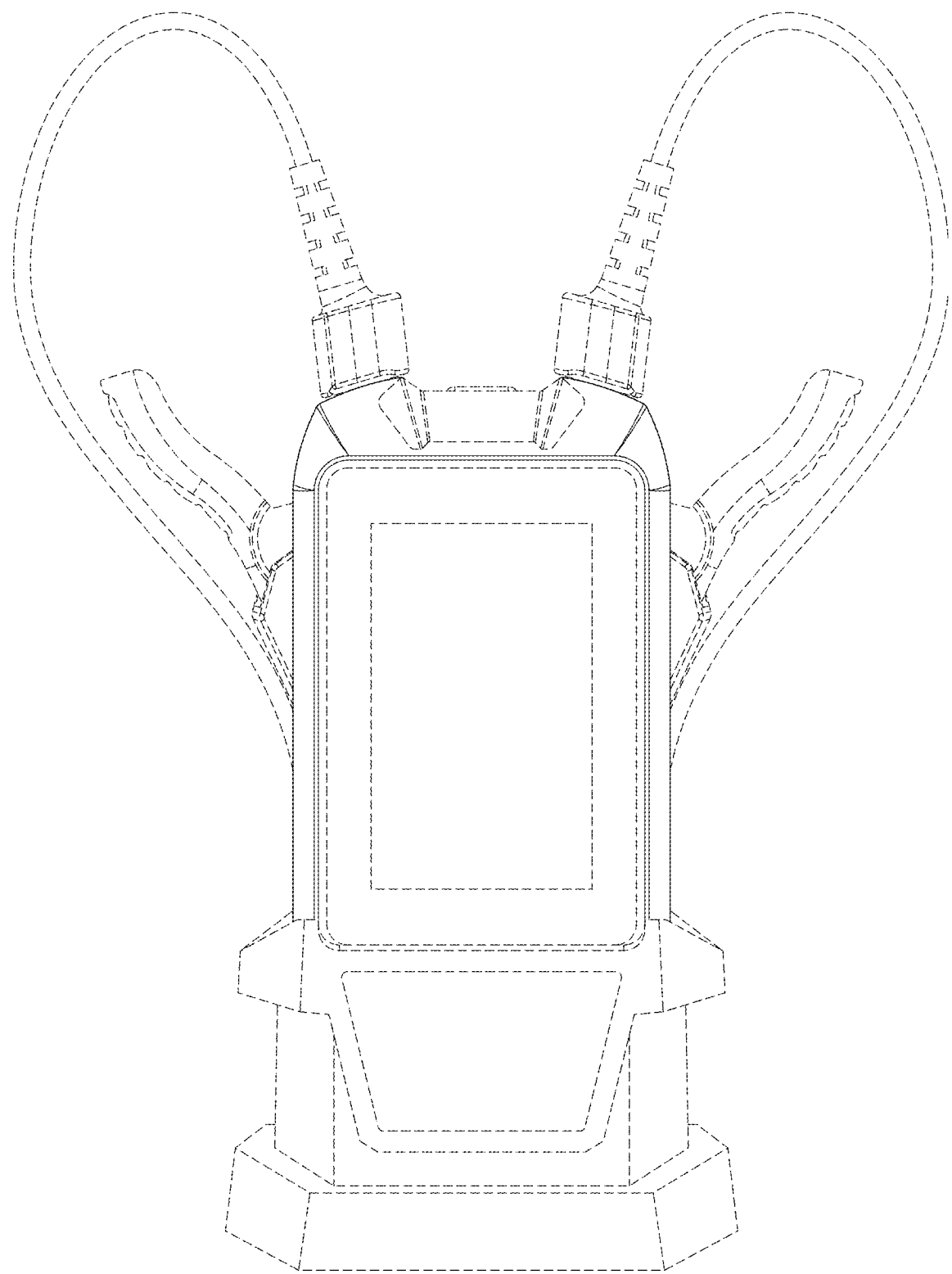
FIG. 3H illustrates a front view of an implementation of an example housing of a battery tester that includes a base in which the batter tester can be disposed.
Figure 3I:
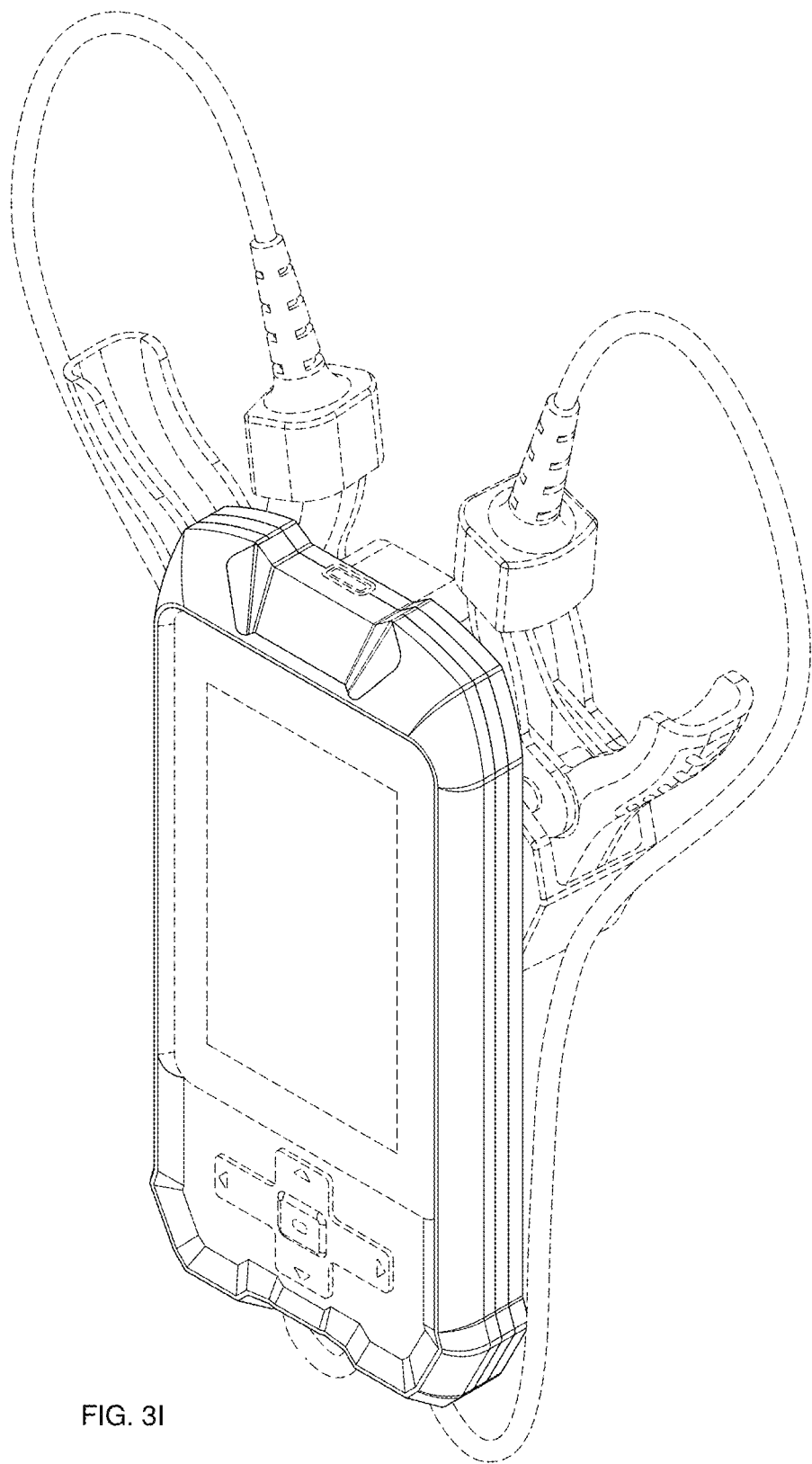
FIG. 3I illustrates a front perspective view of an implementation of the example housing of the battery tester, illustrated in FIG. 3H.
Figure 3J:
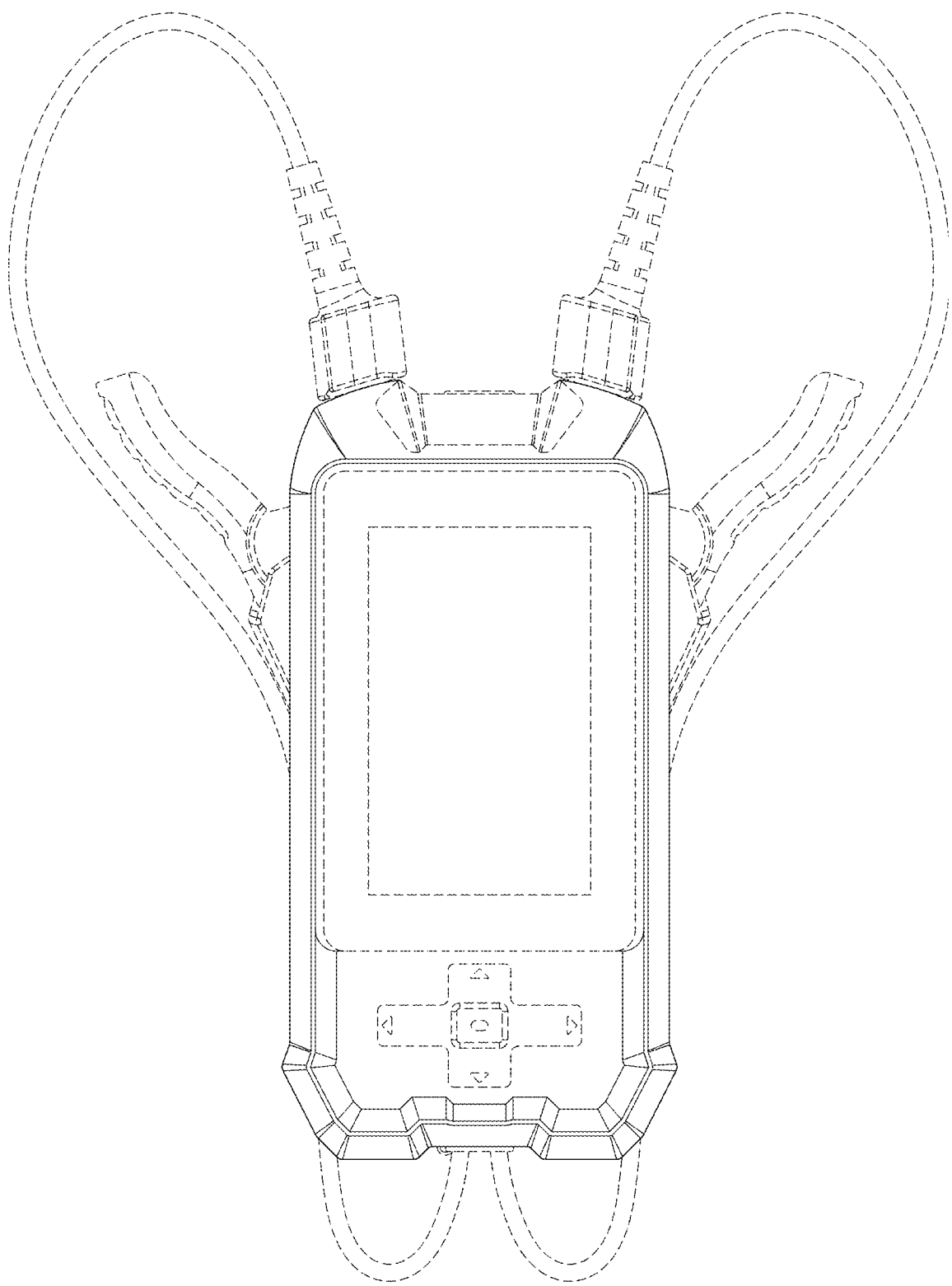
FIG. 3J illustrates a front view of an implementation of the example housing of the battery tester, illustrated in FIG. 3H.
Figure 3K:
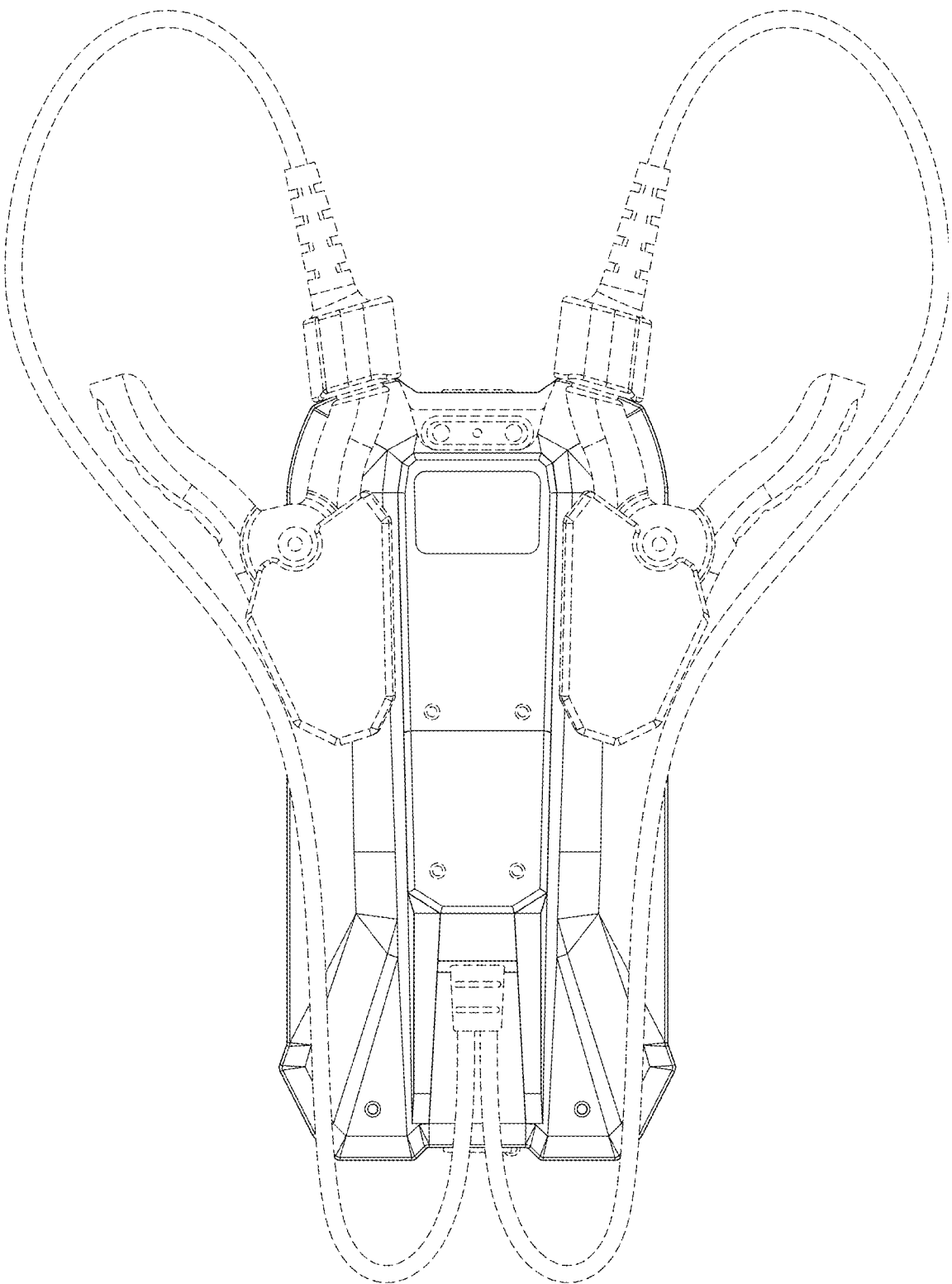
FIG. 3K illustrates a back view of an implementation of the example housing of the battery tester, illustrated in FIG. 3H.
Figure 3L:
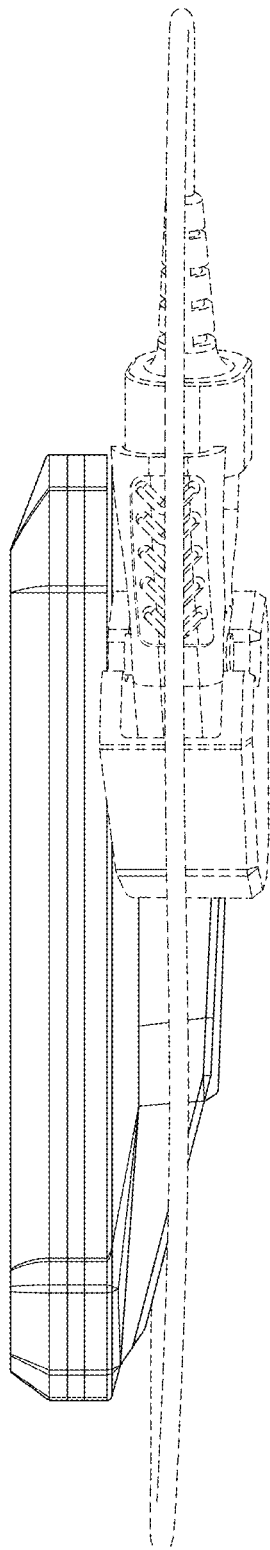
FIG. 3L illustrates a side view of an implementation of the example housing of the battery tester, illustrated in FIG. 3H.
Figure 3M:
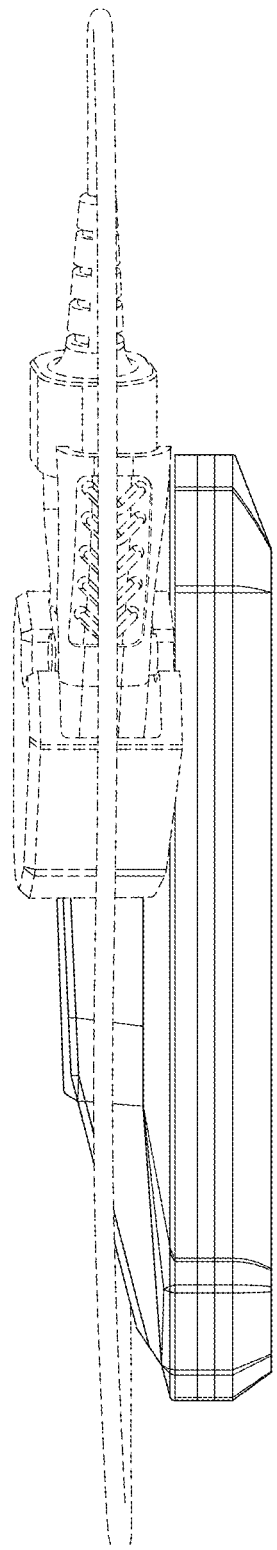
FIG. 3M illustrates a side view of an implementation of the example housing of the battery tester, illustrated in FIG. 3H.
Figure 3N:
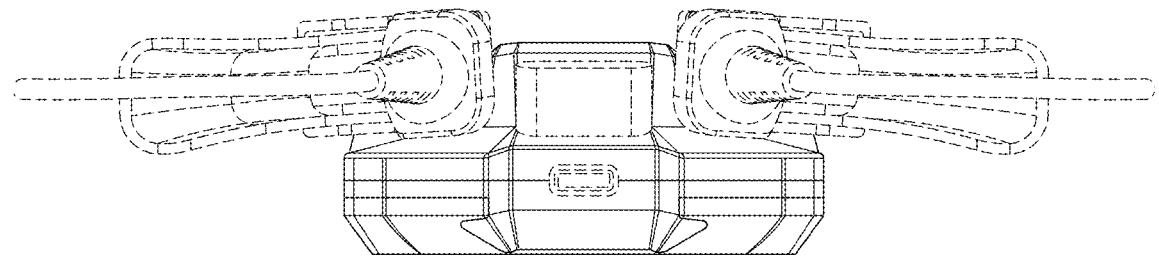
FIG. 3N illustrates a top view of an implementation of the example housing of the battery tester, illustrated in FIG. 3H.
Figure 3O:
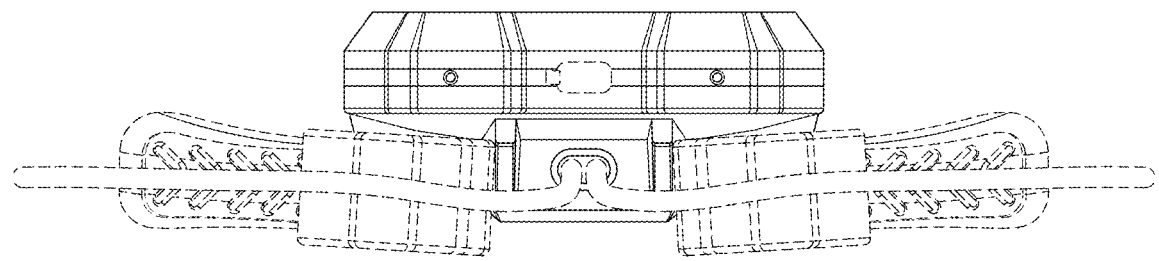
FIG. 3O illustrates a bottom view of an implementation of the example housing of the battery tester, illustrated in FIG. 3H.
Figure 3P:
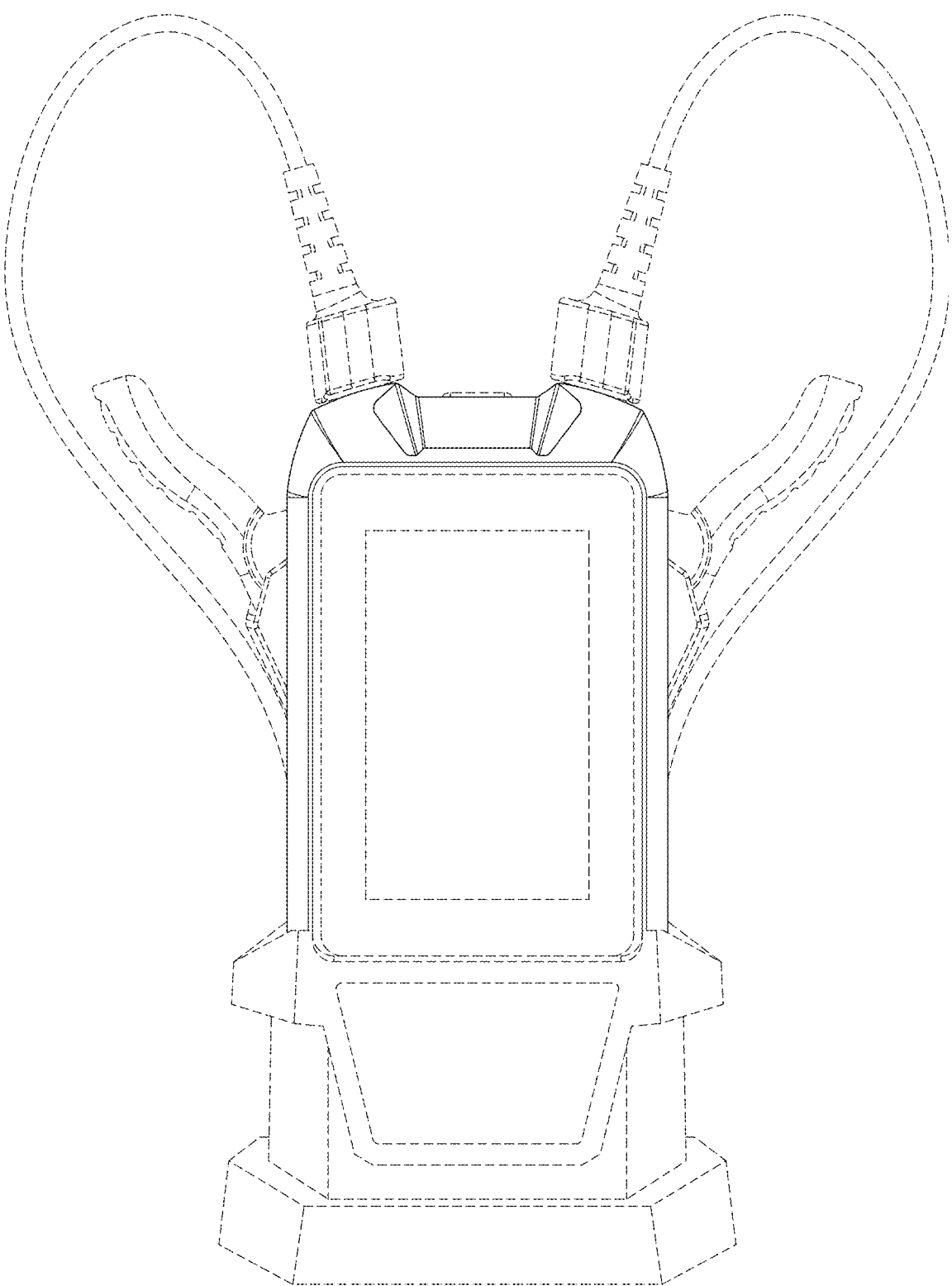
FIG. 3P illustrates a front view of an implementation of the example housing of the battery tester, as illustrated in FIG. 3H, disposed in a base.
Figure 4A:
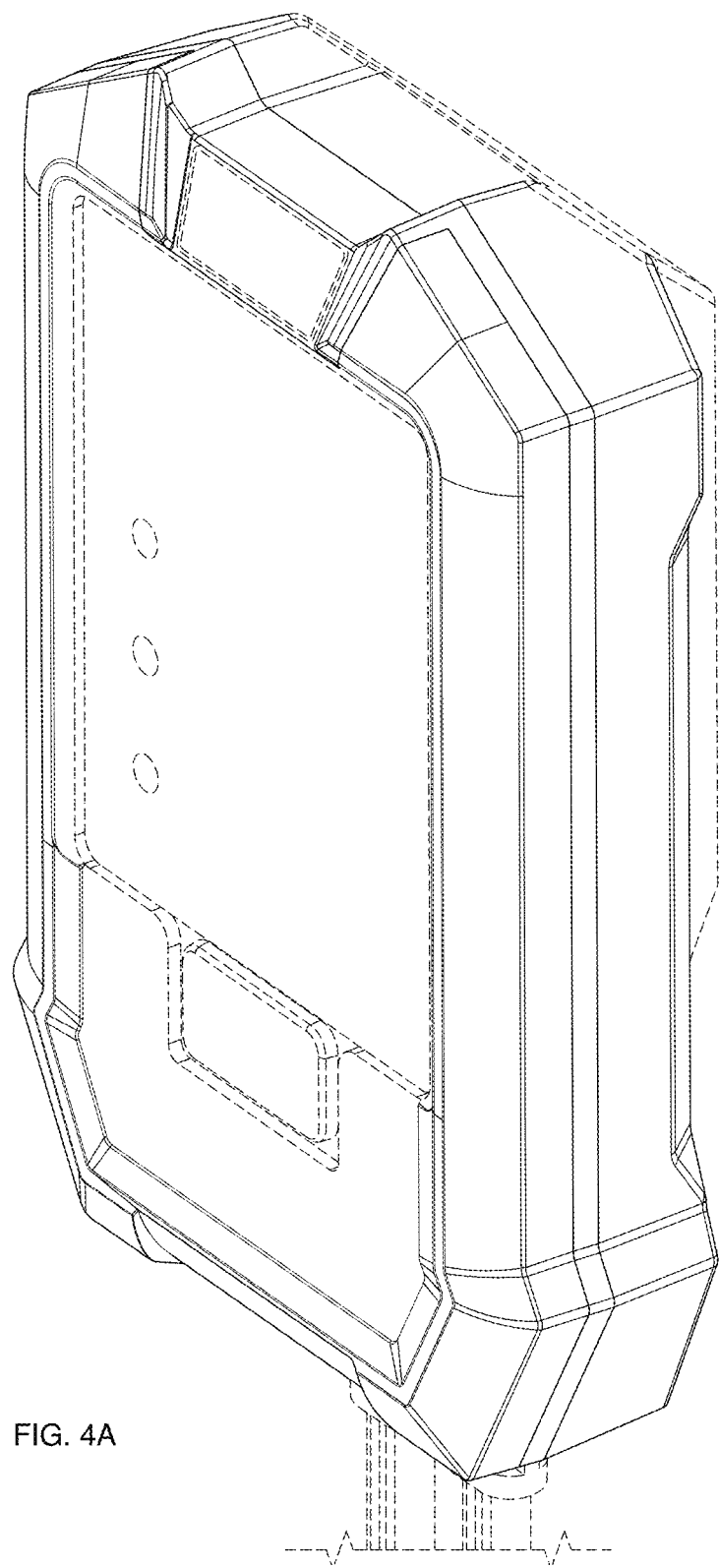
FIG. 4A illustrates a front perspective view of an implementation of an example housing of a battery tester.
Figure 4B:
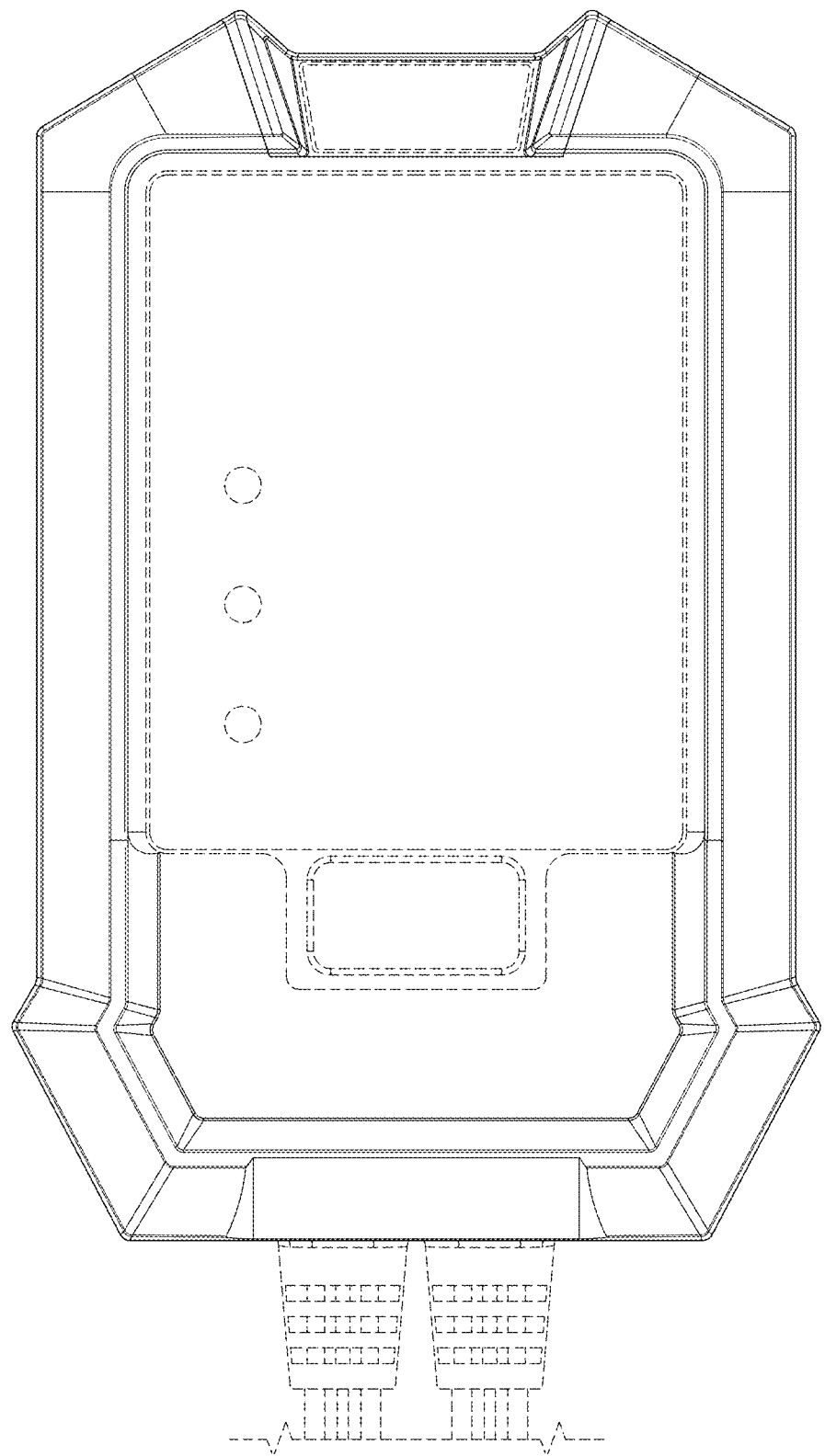
FIG. 4B illustrates a front view of an implementation of the example housing of the battery tester, illustrated in FIG. 4A.
Figure 4C:
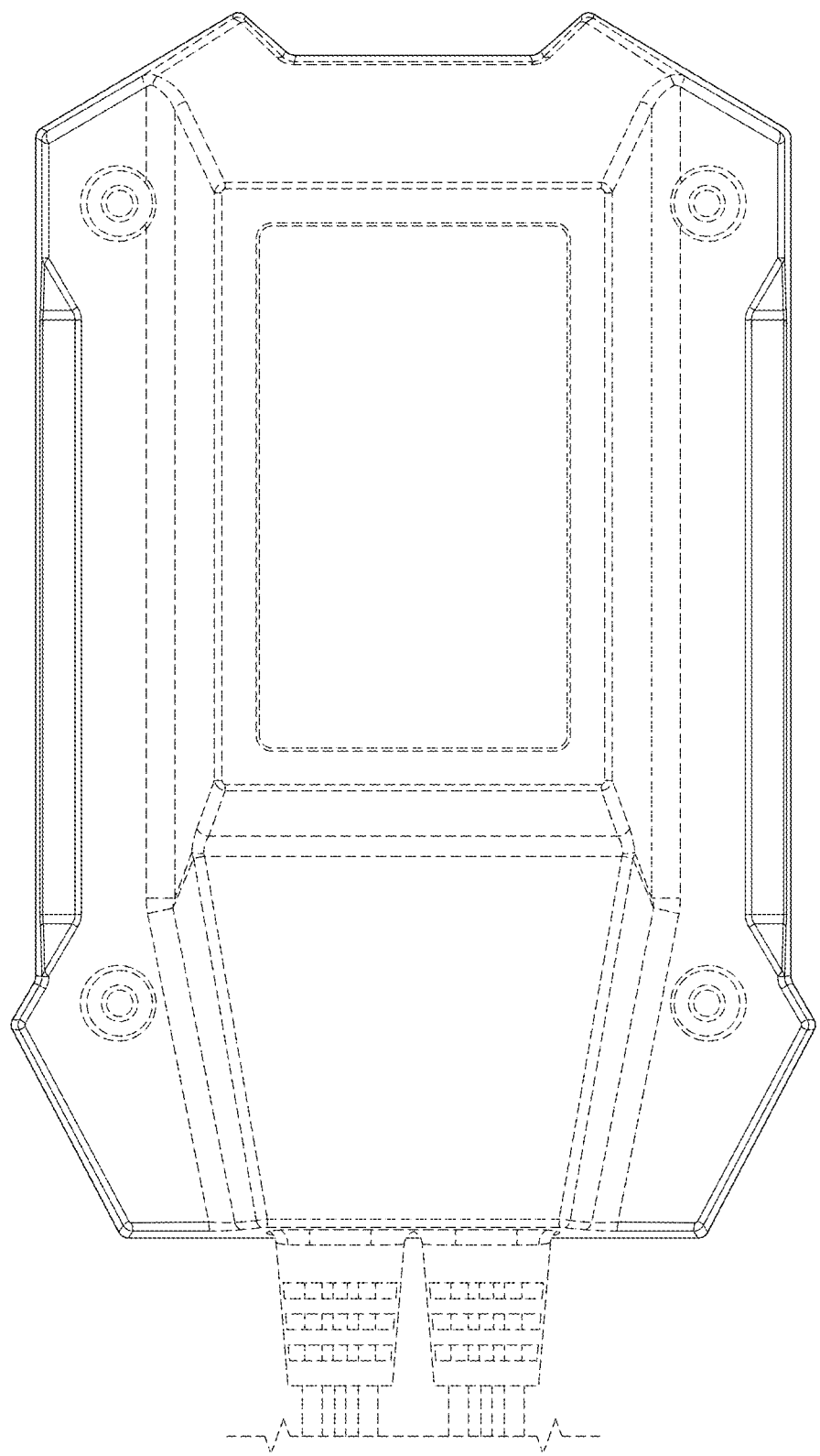
FIG. 4C illustrates a back view of an implementation of the example housing of the battery tester, illustrated in FIG. 4A.
Figure 4F:
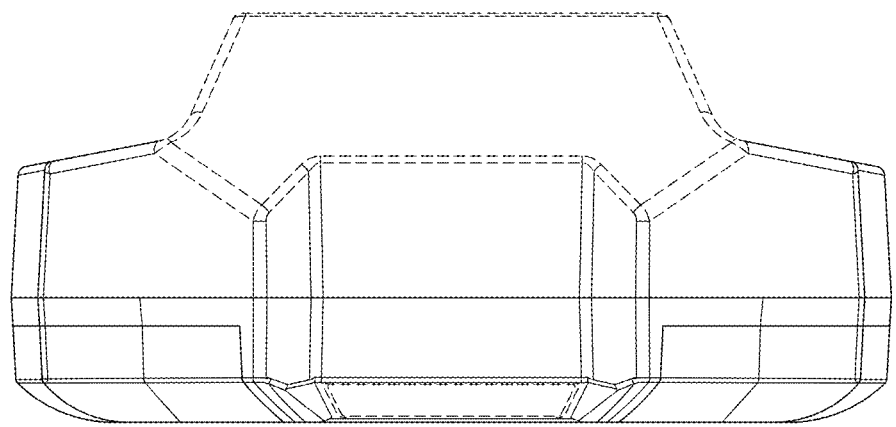
FIG. 4F illustrates a top view of an implementation of the example housing of the battery tester, illustrated in FIG. 4A.
Figure 4G:
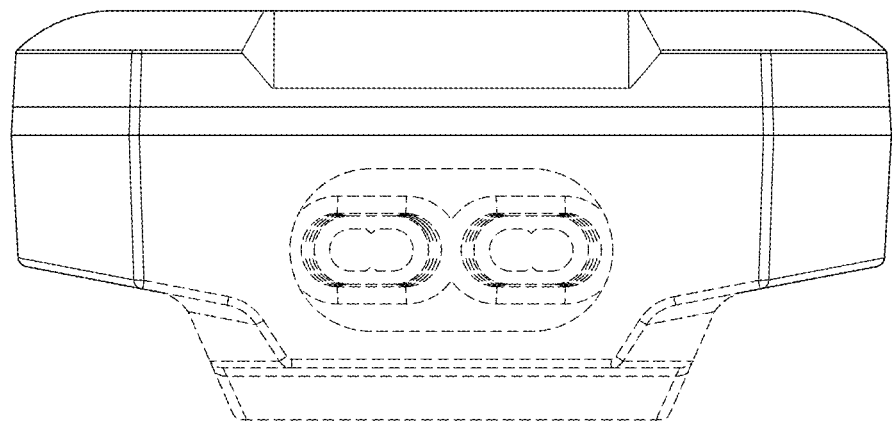
FIG. 4G illustrates a bottom view of an implementation of the example housing of the battery tester, illustrated in FIG. 4A.

FIGS. 3A-3P an implementation of an example battery tester housing and portions thereof. The housing may include two or more parts. In some implementations, the housing includes magnets to operate as a magnetic battery tester housing as described herein.

FIGS. 4A-4G illustrate an implementation of an example battery tester housing and portions thereof. The housing may include two or more parts. In some implementations, the housing includes magnets to operate as a magnetic battery tester housing as described herein.

Figure 5A:
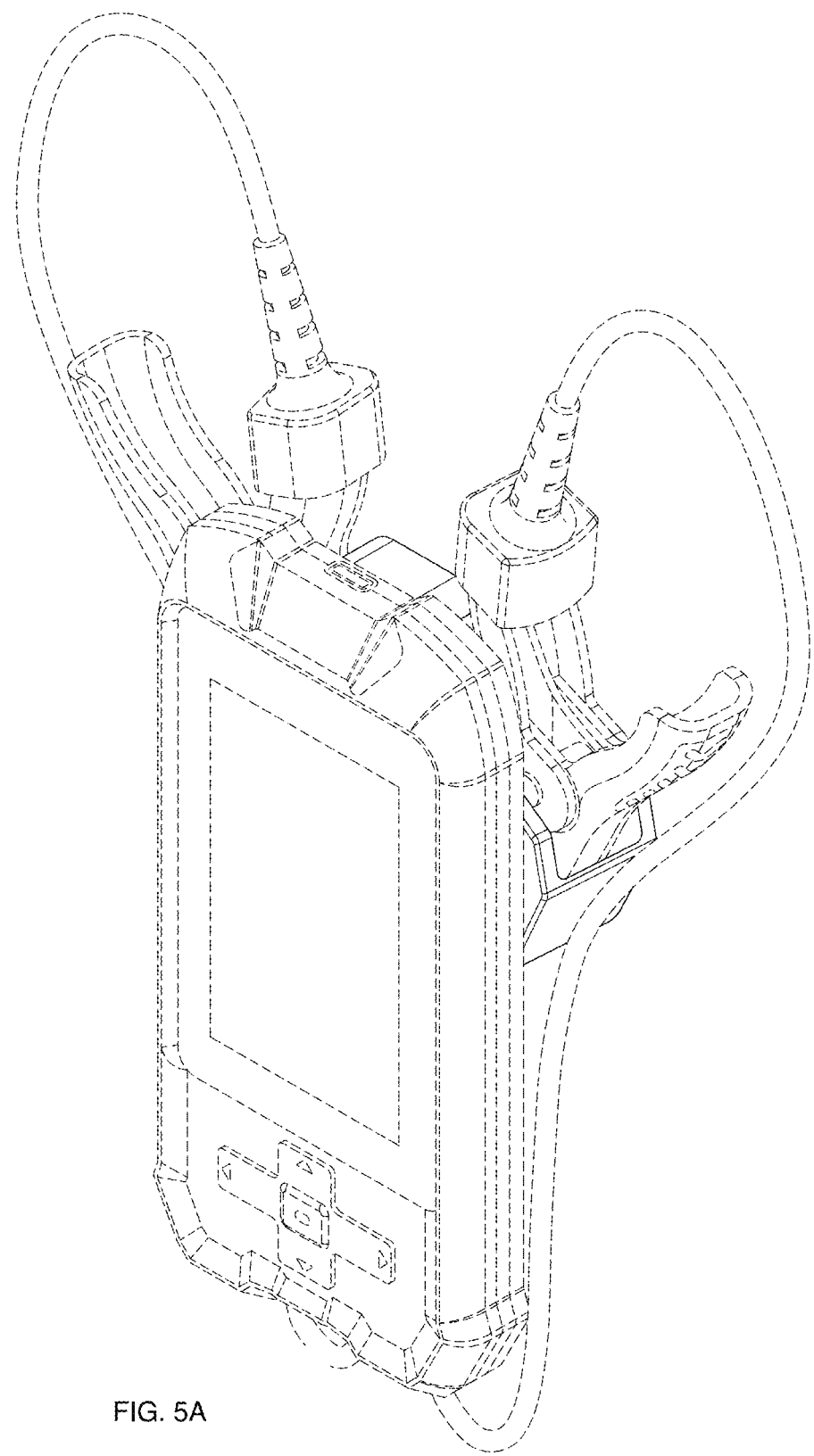
FIG. 5A illustrates a front perspective view of an implementation of an example housing of a battery tester.
Figure 5B:
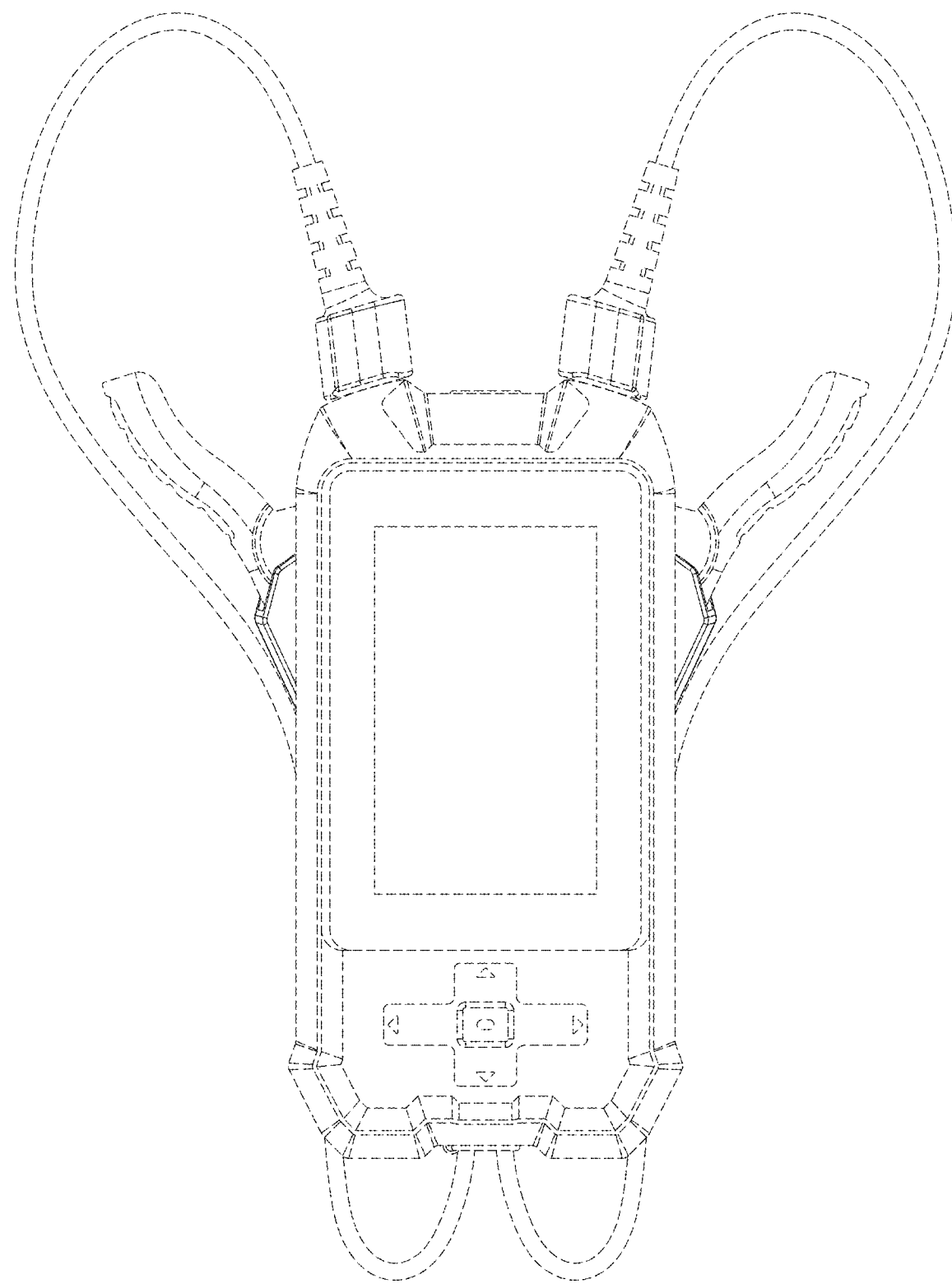
FIG. 5B illustrates a front view of an implementation of the example housing of the battery tester, illustrated in FIG. 5A.
Figure 5C:
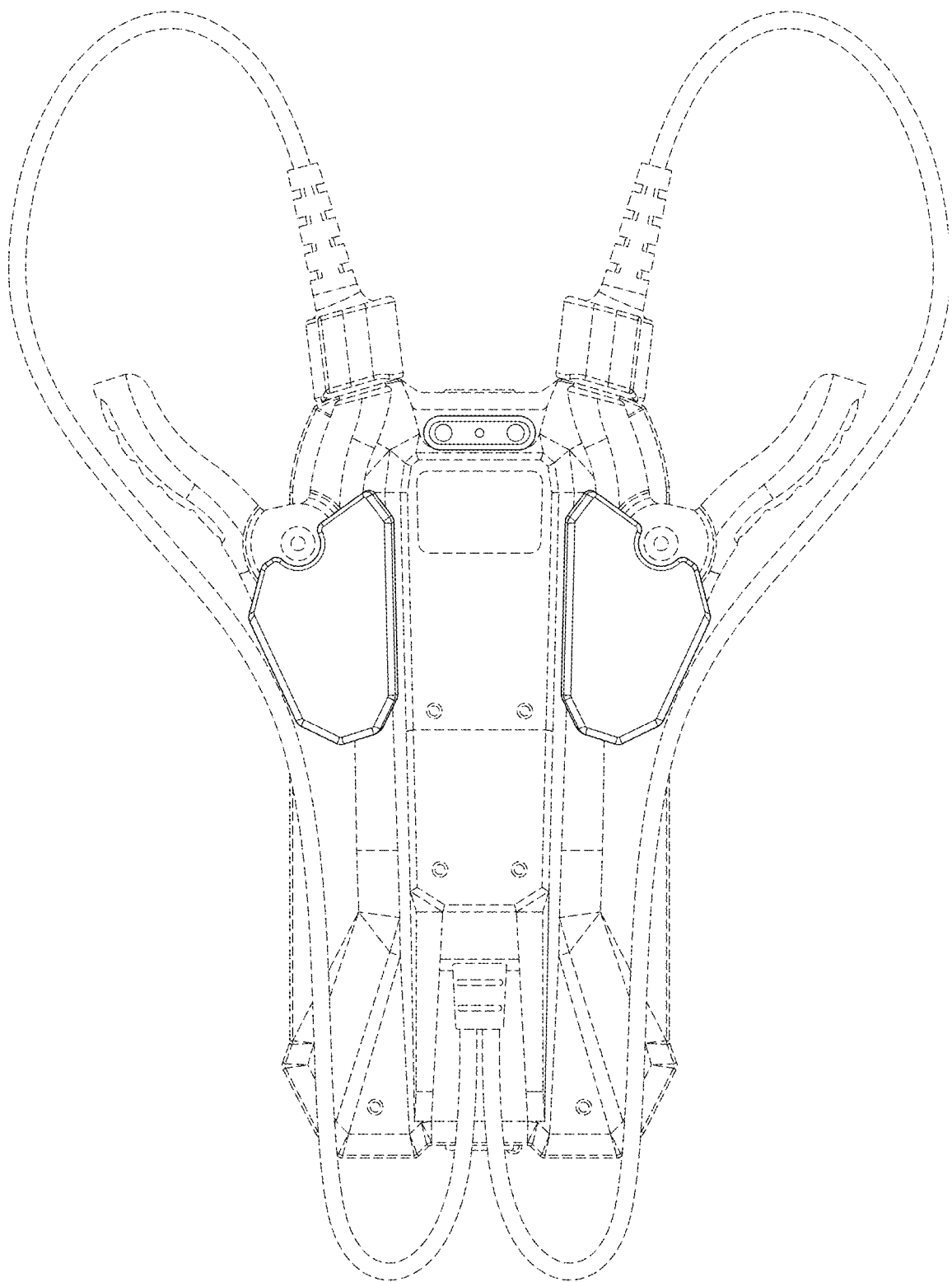
FIG. 5C illustrates a back view of an implementation of the example housing of the battery tester, illustrated in FIG. 5A.
Figure 5D:
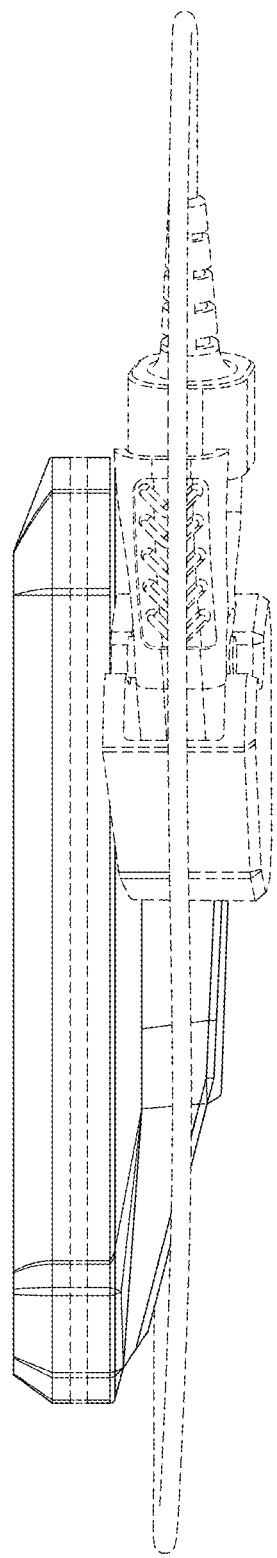
FIG. 5D illustrates a side view of an implementation of the example housing of the battery tester, illustrated in FIG. 5A.
Figure 5E:
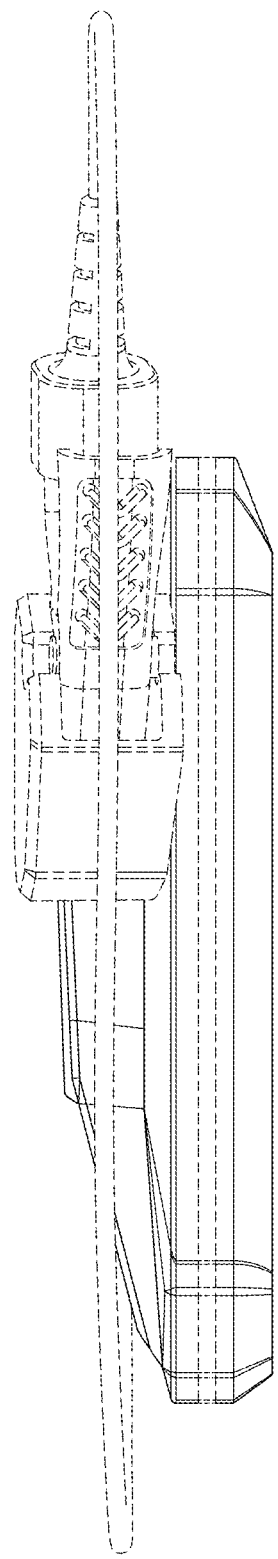
FIG. 5E illustrates a side view of an implementation of the example housing of the battery tester, illustrated in FIG. 5A.
Figure 5F:
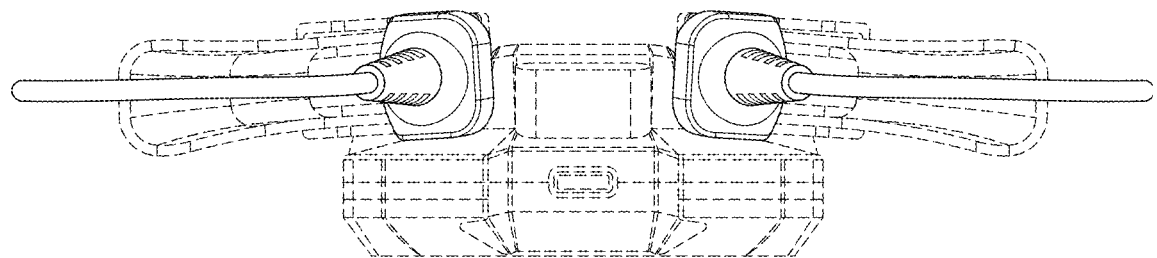
FIG. 5F illustrates a top view of an implementation of the example housing of the battery tester, illustrated in FIG. 5A.
Figure 5G:
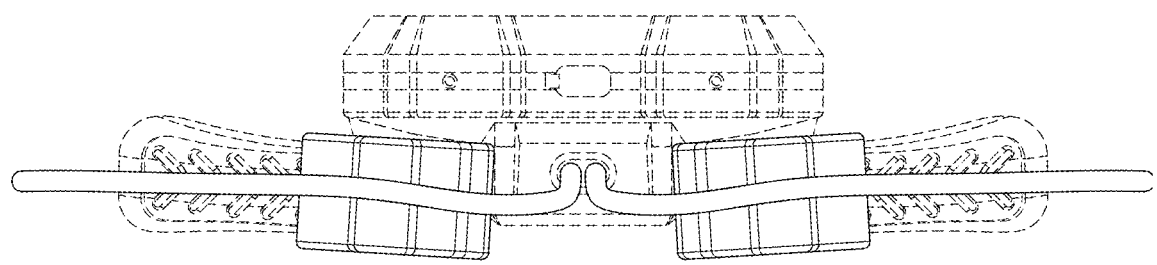
FIG. 5G illustrates a bottom view of an implementation of the example housing of the battery tester, illustrated in FIG. 5A.
Figure 5H:
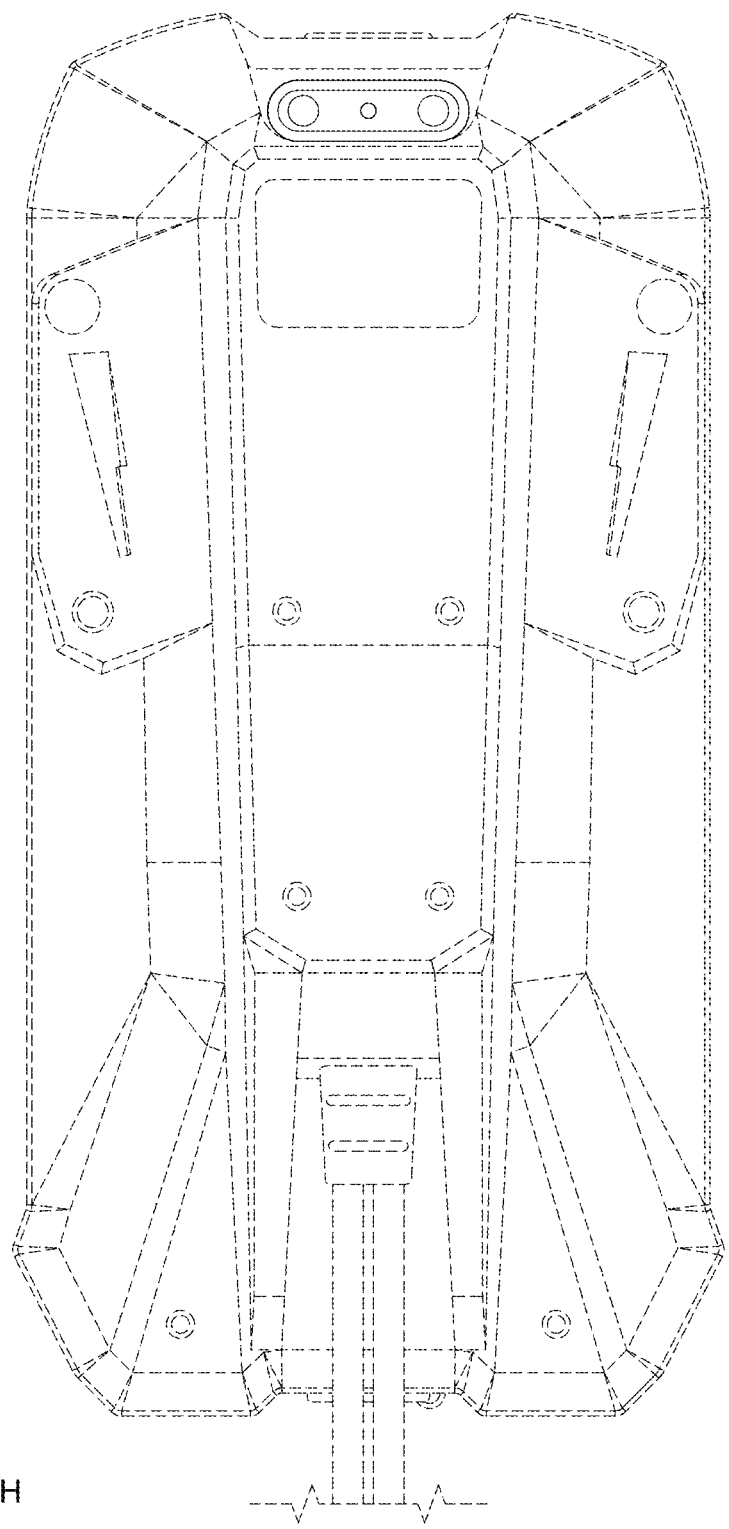
FIG. 5H illustrates a back view of an implementation of the example housing of the battery tester, illustrated in FIG. 5A, with the removable holsters for the clamps removed from the housing.
Figure 5I:
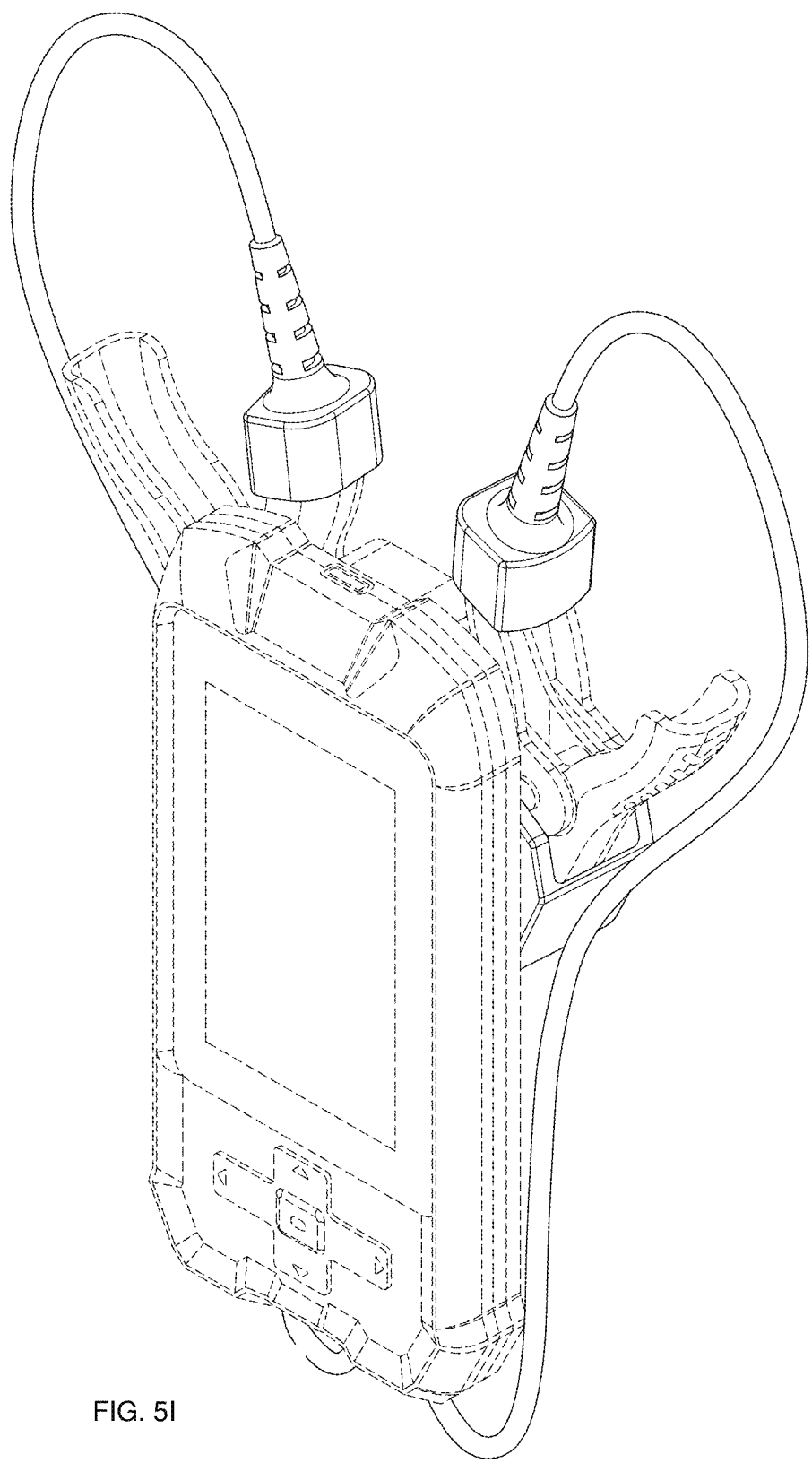
FIG. 5I illustrates a front perspective view of an implementation of an example housing of a battery tester that includes a base in which the batter tester can be disposed.
Figure 5J:
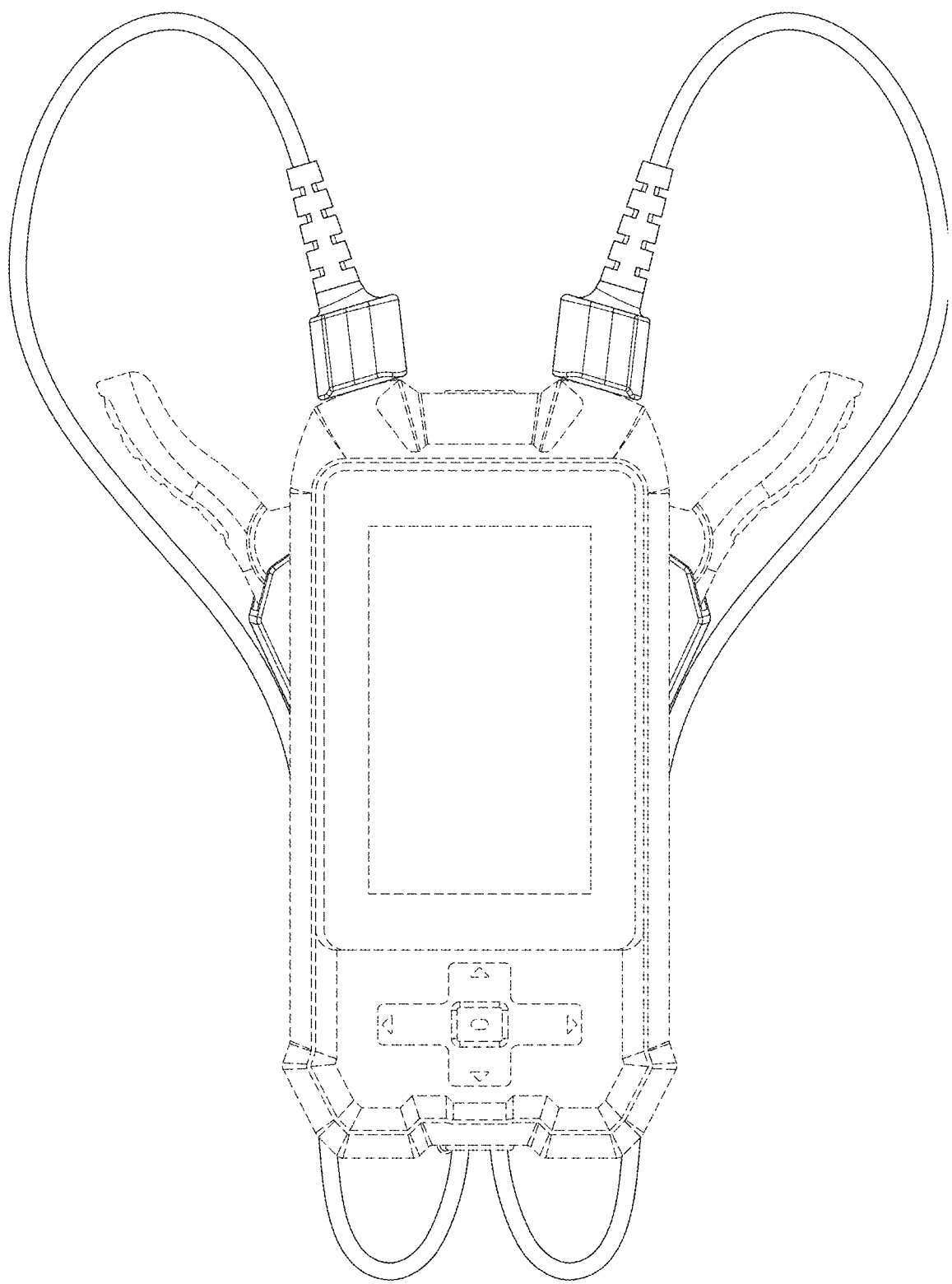
FIG. 5J illustrates a front view of an implementation of the example housing of the battery tester, illustrated in FIG. 5I.
Figure 5K:
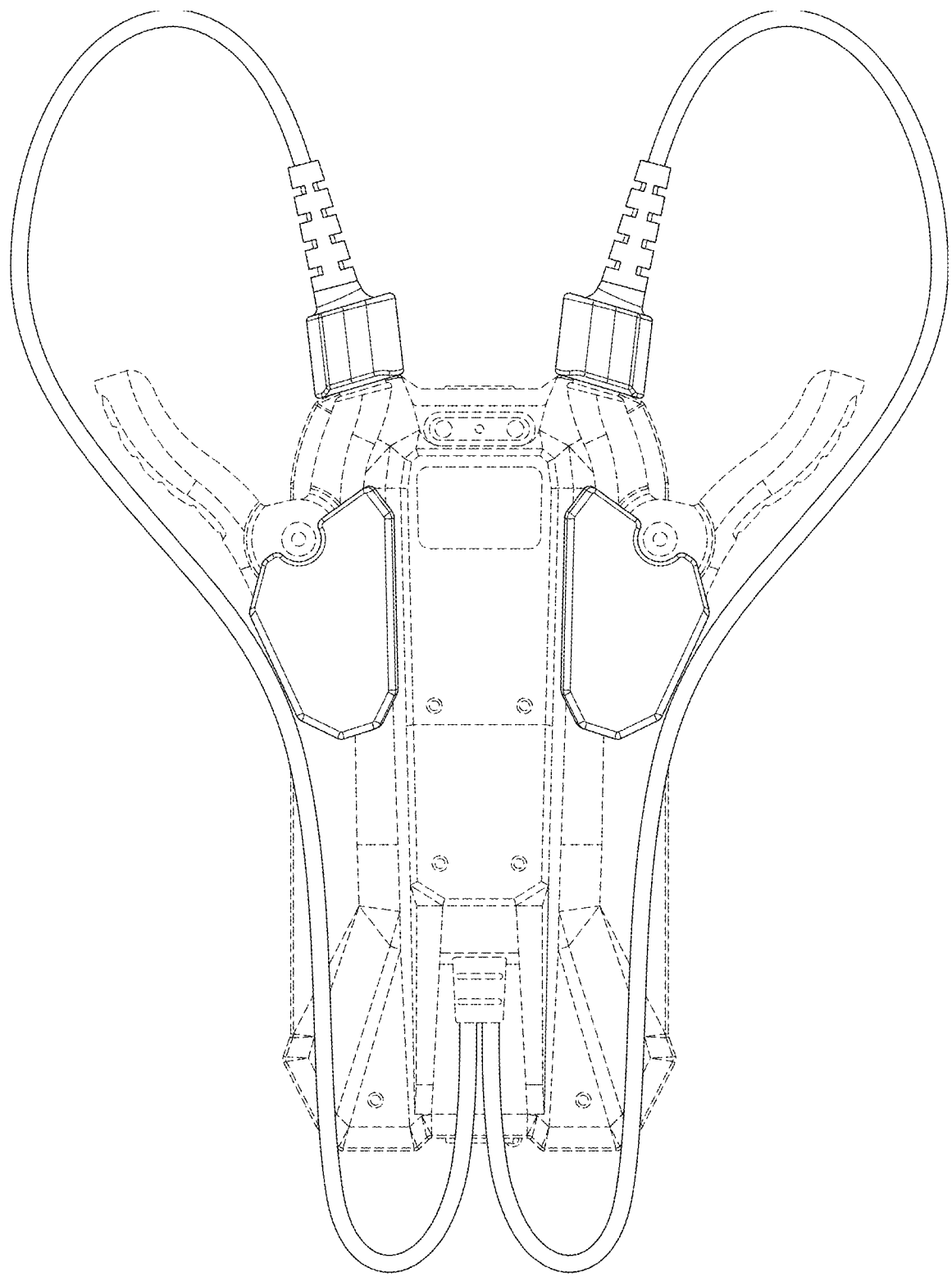
FIG. 5K illustrates a back view of an implementation of the example housing of the battery tester, illustrated in FIG. 5I.
Figure 5L:
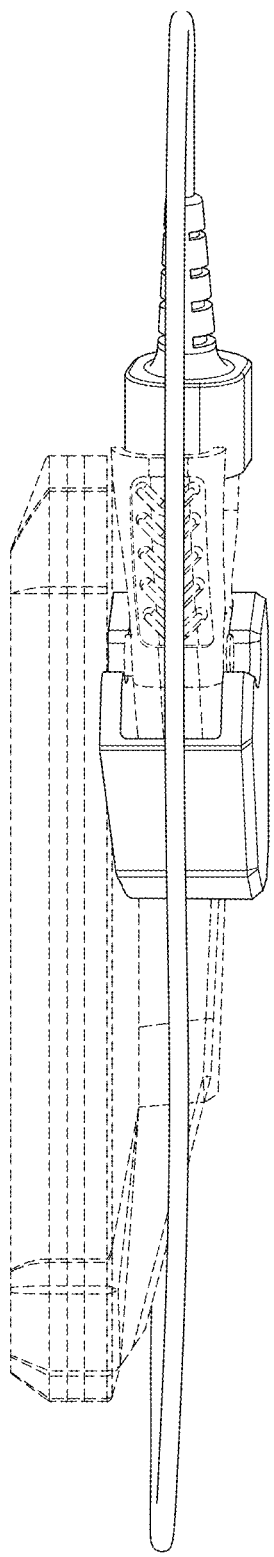
FIG. 5L illustrates a side view of an implementation of the example housing of the battery tester, illustrated in FIG. 5I.
Figure 5M:
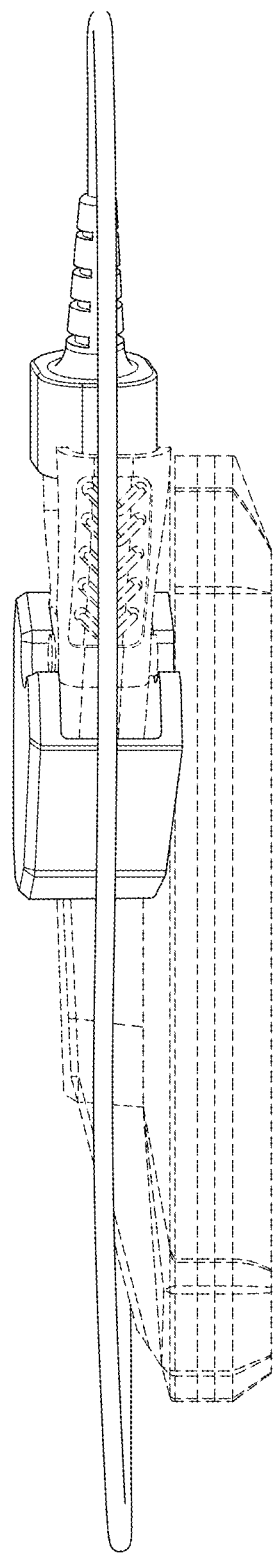
FIG. 5M illustrates a side view of an implementation of the example housing of the battery tester, illustrated in FIG. 5I.
Figure 5N:
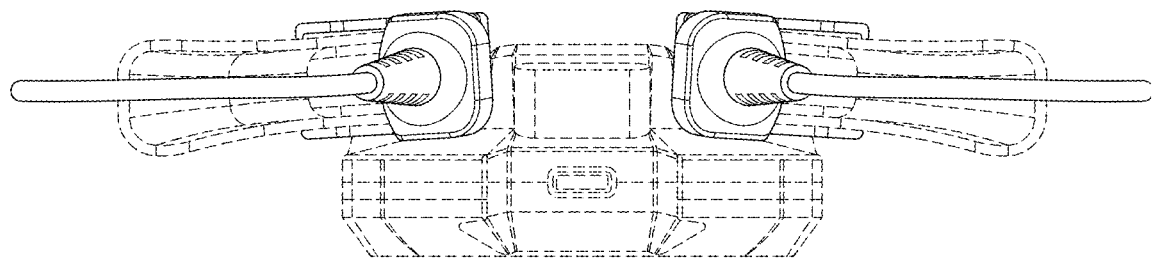
FIG. 5N illustrates a top view of an implementation of the example housing of the battery tester, illustrated in FIG. 5I.
Figure 5O:
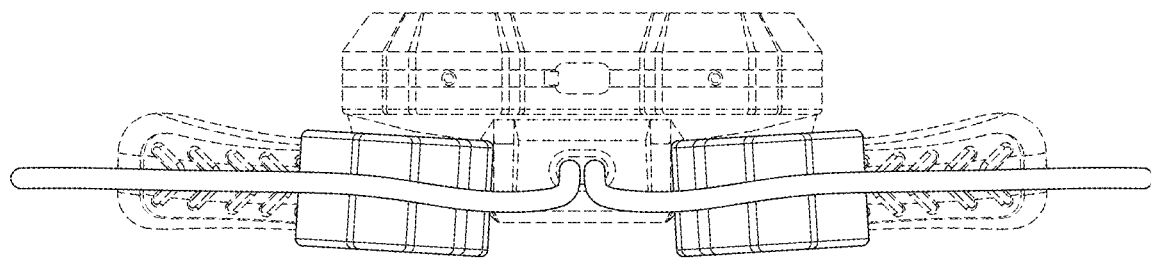
FIG. 5O illustrates a bottom view of an implementation of the example housing of the battery tester, illustrated in FIG. 5I.

FIGS. 5A-5O illustrate an implementation of an example battery tester housing and portions thereof. The housing may include two or more parts. In some implementations, the housing includes magnets to operate as a magnetic battery tester housing as described herein. As illustrated in FIG. 5H, the holsters for the clamps may be removable. The outer surface of the second part of the housing may include holster recesses and the outer surface of the holsters may include protrusions receivable by the holster recesses of the housing. The holsters may be coupled by sliding and/or snapping the holster onto the outer surface of the second part of the housing.

In some implementations, the magnet(s) and/or magnet receiving members(s) may be disposed on an inner surface of the first side. For example, the magnet(s) may be coupled to an inner surface of the first side such that at least a portion of the outer surface of the first part of the housing contacts the magnetic surface when coupled to the magnetic surface. Coupling the first part may protect the "face" of the battery tester (e.g., presentation interface such as lighting components and/or screen; input device; etc.) when not in use.

In some implementations the magnet(s) and/or magnet receiving member(s) may be disposed on an outer surface of the first side and/or second side of the housing. Positioning the magnets on an outer surface may facilitate replacement of magnets and/or facilitate coupling of the battery tester on a magnetic surface since the magnetic region may be visible.

Although the first part and the second part are described and illustrated as separate pieces, the first part and the second part may be joined (e.g., clamshell arrangement). Although the first part and the second part are described and illustrated as unibody pieces the first and/or second parts may include one or more segments that form the first part and/or second part.

Described process(es) may be implemented by various systems, such as the systems described herein. In addition, various operations may be added, deleted, and/or modified. In some implementations, operations of the process(es) may be performed in combination with other described processes or portions thereof.

As described herein, terms describing position such as front, back, top, bottom are relative terminology used to designate a side from another side. The term describing position may or may not correspond to an orientation to a user during use.

It is to be understood the implementations are not limited to particular systems or processes described which may, of course, vary. It is also to be understood that the terminology used herein is for the purpose of describing particular implementations only, and is not intended to be limiting. As used in this specification, the singular forms "a", "an" and "the" include plural referents unless the content clearly indicates otherwise. Thus, for example, reference to "a holster" includes a combination of two or more holsters and reference to "a keypad" includes different types and/or combinations of keypads.

Although the present disclosure has been described in detail, it should be understood that various changes, substitutions and alterations may be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The invention claimed is:

1. A battery tester capable of testing a strength of a battery, the battery tester comprising:
    a housing comprising:
        a first side;
        a second opposing side;
        a third side disposed between the first side and the second side of the housing;
        a fourth side disposed between the first side and the second side of the housing;
        a first part;
        a second part coupled to the first part, wherein the second part comprises:
            an inner surface;
            an outer surface;
            a raised portion that extends from the outer surface;
            four or more magnet receiving members disposed on the inner surface in the raised portion; and
            four or more magnets disposed in the four or more magnet receiving members, wherein the four or more magnets comprises:
                a first magnet;
                a second magnet;
                a third magnet; and
                a fourth magnet;
                wherein the first magnet and the second magnet are disposed closer to the first side than the third magnet and the fourth magnet; and wherein the first magnet and the third magnet are disposed closer to the third side than the second magnet and the fourth magnet; and
        a cavity disposed between the coupled first part and the second part, wherein the cavity extends into the inner surface of the raised portion extending from the outer surface, and wherein the cavity is configured to receive the magnets and one or more components capable of testing a strength of a battery;

wherein the housing of the battery tester is magnetic such that the battery tester can be coupled to a magnetic surface.

2. The battery tester of claim 1 wherein the housing further comprises ports proximate the second side of the housing; and cables extending through the ports and coupled to clamps, wherein the clamps are configured to contact battery leads during testing of a strength of the battery.

3. The battery tester of claim 1 wherein one or more of the magnets comprise neodymium magnets.

4. The battery tester of claim 1 wherein at least a portion of the second part of the housing includes a rubberized outer surface.

5. The battery tester of claim 1 wherein at least a portion of the second part of the housing has a greater potential friction than the first part of the housing to inhibit movement of the battery tester when coupled to the magnetic surface.

6. The battery tester of claim 1 wherein the housing further comprises a third part disposed between the first part and the second part when the first part and the second of the housing are coupled.

7. The battery tester of claim 1 wherein the third part comprises a gasket.

8. The battery tester of claim 1 wherein the first part and the second part comprise chamfered corners.

9. The battery tester of claim 1 wherein the first part and the second part comprise one or more beveled edges.

10. A battery tester housing comprising:
a first side;
a second opposing side;
a third side disposed between the first side and the second side of the housing;
a fourth side disposed between the first side and the second side of the housing;
a first part;
a second part coupled to the first part, wherein the second part comprises:
an inner surface;
an outer surface;
four or more magnet receiving members disposed on the inner surface of the second part of the housing; and
four or more magnets disposed in the four or more magnet receiving members, wherein the four or more magnets comprises:
a first magnet;
a second magnet;
a third magnet; and
a fourth magnet;
wherein the first magnet and the second magnet are disposed closer to the first side than the third magnet and the fourth magnet; and wherein the first magnet and the third magnet are disposed closer to the third side than the second magnet and the fourth magnet; and
a cavity disposed between the coupled first part and the second part, and wherein the cavity is configured to receive the magnets and one or more components capable of testing a strength of a battery;
wherein the housing of the battery tester is magnetic such that the battery tester can be coupled to a magnetic surface.

11. The battery tester housing of claim 10 further comprising: a raised portion that extends from the outer surface; wherein the cavity extends into the inner surface of the raised portion, wherein the magnet receiving members are disposed in the portion of the cavity that extends into the raised portion.

12. The battery tester housing of claim 10 further comprising ports proximate the second side of the housing; and cables extending through the ports and coupled to clamps, wherein the clamps are configured to contact battery leads during testing of a strength of the battery.

13. The battery tester housing of claim 10 wherein one or more of the magnets comprise neodymium magnets.

14. The battery tester housing of claim 10 wherein at least a portion of the second part of the housing includes a rubberized outer surface.

15. The battery tester housing of claim 10 wherein at least a portion of the second part of the housing has a greater potential friction than the first part of the housing to inhibit movement of the battery tester when coupled to the magnetic surface.

16. The battery tester housing of claim 10 further comprising a third part disposed between the first part and the second part when the first part and the second of the housing are coupled.

17. The battery tester housing of claim 10 wherein the third part comprises a gasket.

18. The battery tester housing of claim 10 wherein the first part and the second part comprise chamfered corners.

19. The battery tester housing of claim 10 wherein the first part and the second part comprise one or more beveled edges.

20. The battery tester housing of claim 10 wherein the length of the housing is greater proximate the first side and the second side of the housing than at least a portion of the housing between the first side and the second side.

\* \* \* \* \*